United States Patent
Park et al.

(10) Patent No.: US 10,600,805 B2
(45) Date of Patent: Mar. 24, 2020

(54) VERTICAL MEMORY DEVICES WITH COMMON SOURCE INCLUDING ALTERNATELY REPEATED PORTIONS HAVING DIFFERENT WIDTHS

(71) Applicant: Samsung Electronics Co., Ltd., Suwon-si, Gyeonggi-do (KR)

(72) Inventors: Joo-Hee Park, Seoul (KR); Jong-Min Lee, Seongnam-si (KR); Seon-Kyung Kim, Hwaseong-si (KR); Kee-Jeong Rho, Hwaseong-si (KR); Jin-hyun Shin, Suwon-si (KR); Jong-Hyun Park, Seoul (KR); Jin-Yeon Won, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/157,684

(22) Filed: Oct. 11, 2018

(65) Prior Publication Data

US 2019/0043889 A1 Feb. 7, 2019

Related U.S. Application Data

(63) Continuation of application No. 15/291,662, filed on Oct. 12, 2016, now abandoned.
(Continued)

(30) Foreign Application Priority Data

Dec. 23, 2015 (KR) .......................... 10-2015-0185178

(51) Int. Cl.
*H01L 27/11582* (2017.01)
*H01L 27/11565* (2017.01)
*H01L 27/1157* (2017.01)

(52) U.S. Cl.
CPC .... *H01L 27/11582* (2013.01); *H01L 27/1157* (2013.01); *H01L 27/11565* (2013.01)

(58) Field of Classification Search
CPC ......... H01L 27/11582; H01L 27/11565; H01L 23/5283
See application file for complete search history.

(56) References Cited

U.S. PATENT DOCUMENTS 7,679,133 B2 3/2010 Son et al.
8,187,936 B2 5/2012 Alsmeier et al.
(Continued)

FOREIGN PATENT DOCUMENTS

KR      10-0755137 B1      9/2007
KR      2013-0080983 A      7/2013
(Continued)

*Primary Examiner* — Matthew E. Gordon
(74) *Attorney, Agent, or Firm* — Harness, Dickey & Pierce, P.L.C.

(57) ABSTRACT

A vertical memory device includes a substrate, a plurality of channels on the substrate and extending in a first direction that vertical to a top surface of the substrate, a plurality of gate lines and a conductive line on the substrate. The gate lines are stacked on top of each other. The gate lines surround the channels. The gate lines are spaced apart from each other along the first direction. The conductive line cuts the gate lines along the first direction. A width of the conductive line is periodically and repeatedly changed.

20 Claims, 35 Drawing Sheets

Related U.S. Application Data

(60) Provisional application No. 62/240,660, filed on Oct. 13, 2015.

(56) References Cited

U.S. PATENT DOCUMENTS

| | | |
|---|---|---|
| 8,501,509 B2 | 8/2013 | Roizin et al. |
| 8,508,999 B2 | 8/2013 | Liu et al. |
| 8,553,466 B2 | 10/2013 | Han et al. |
| 8,559,235 B2 | 10/2013 | Yoon et al. |
| 8,564,587 B2 | 10/2013 | Lee et al. |
| 8,969,947 B2 | 3/2015 | Lee et al. |
| 2004/0041199 A1 | 3/2004 | Kim |
| 2008/0002475 A1 | 1/2008 | Yang et al. |
| 2010/0171162 A1 | 7/2010 | Katsumata et al. |
| 2011/0090737 A1 | 4/2011 | Yoo et al. |
| 2011/0233648 A1 | 9/2011 | Seol et al. |
| 2012/0086072 A1 | 4/2012 | Yun et al. |
| 2013/0302980 A1 | 11/2013 | Chandrashekar et al. |
| 2014/0217488 A1 | 8/2014 | Thimmegowda et al. |
| 2016/0268263 A1* | 9/2016 | Lee .................... H01L 27/2481 |
| 2017/0077119 A1* | 3/2017 | Sawabe ............. H01L 27/11582 |

FOREIGN PATENT DOCUMENTS

| | | |
|---|---|---|
| KR | 2014-0020139 A | 2/2014 |
| KR | 2014-0134428 A | 11/2014 |

* cited by examiner

FIG. 2B
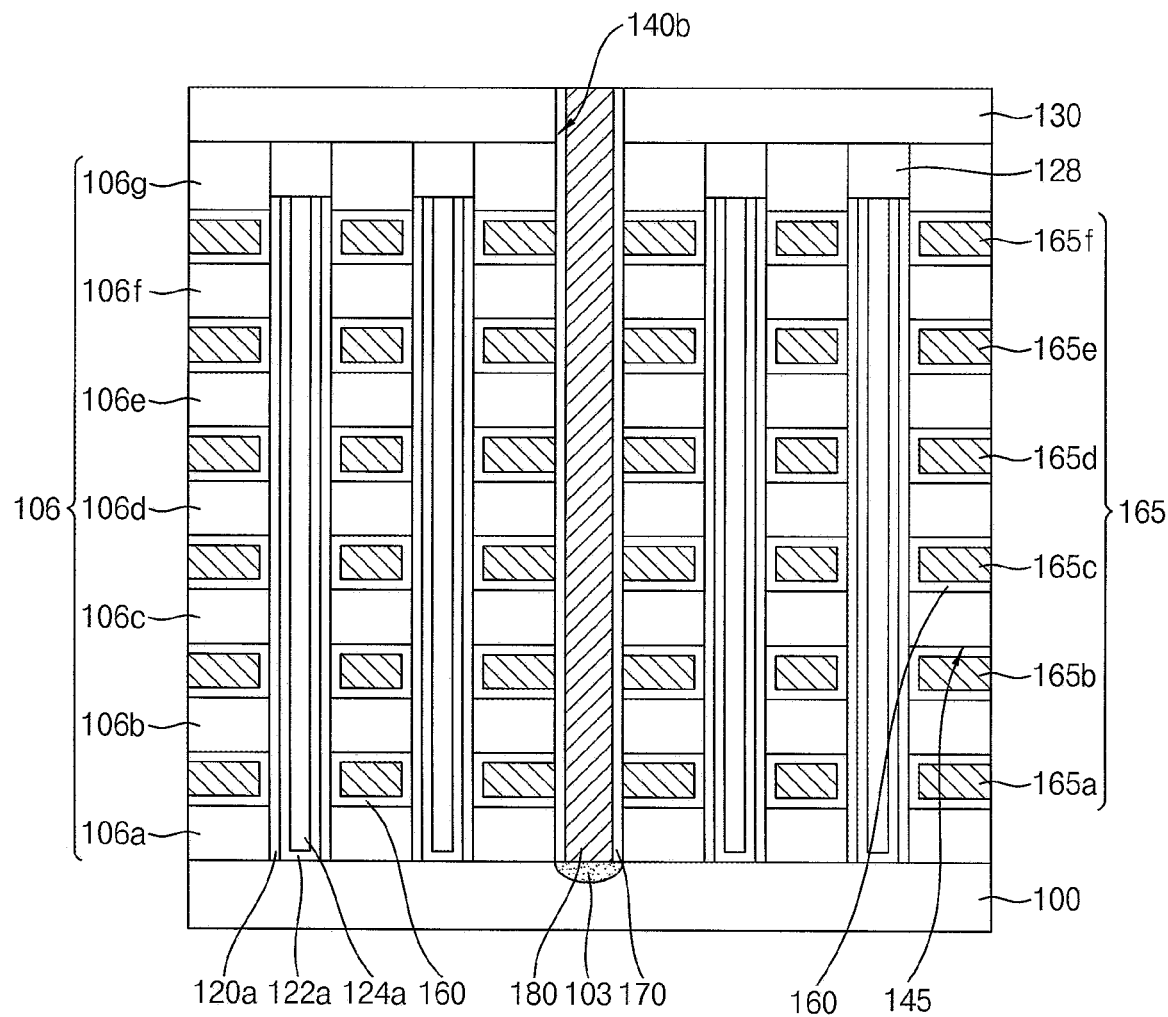
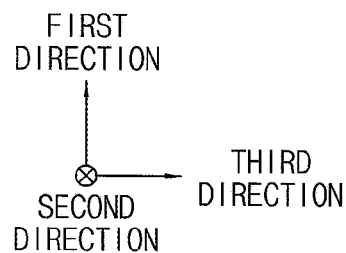

FIG 5
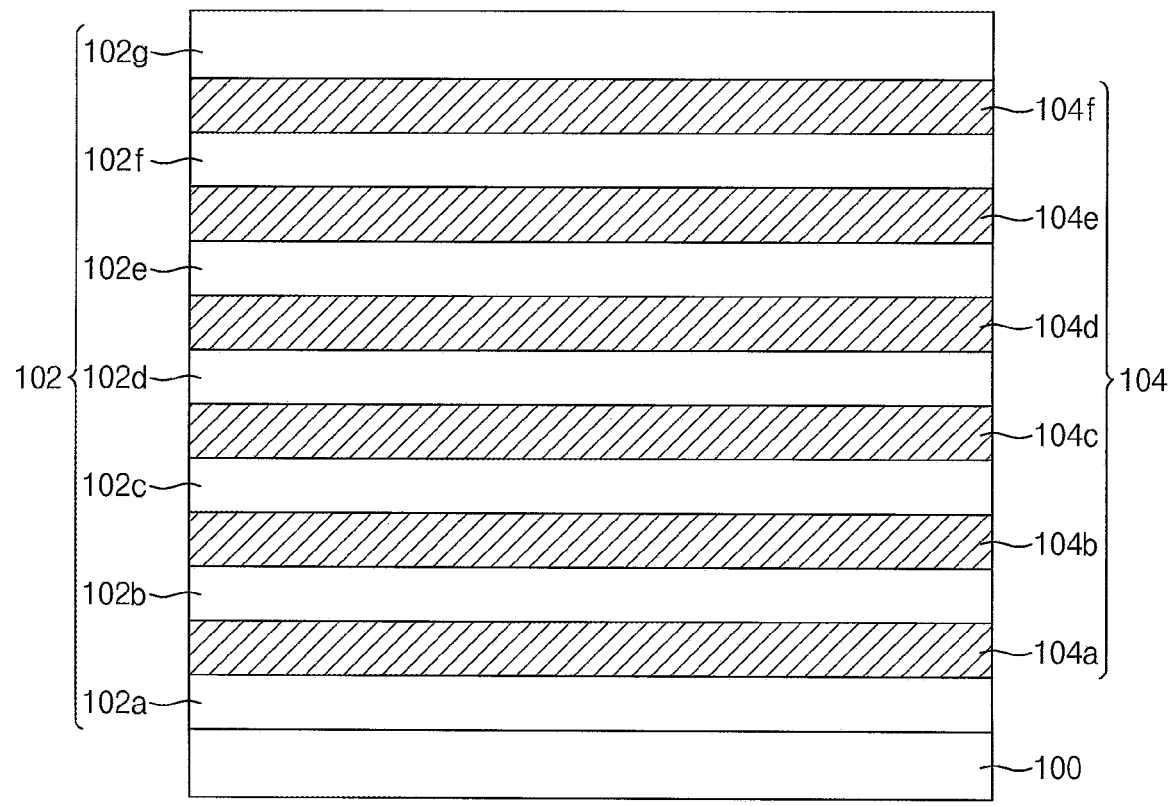
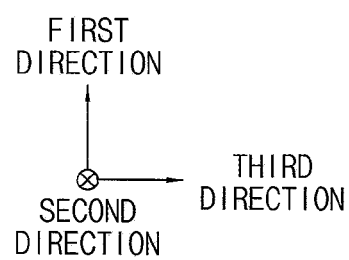

FIG. 7
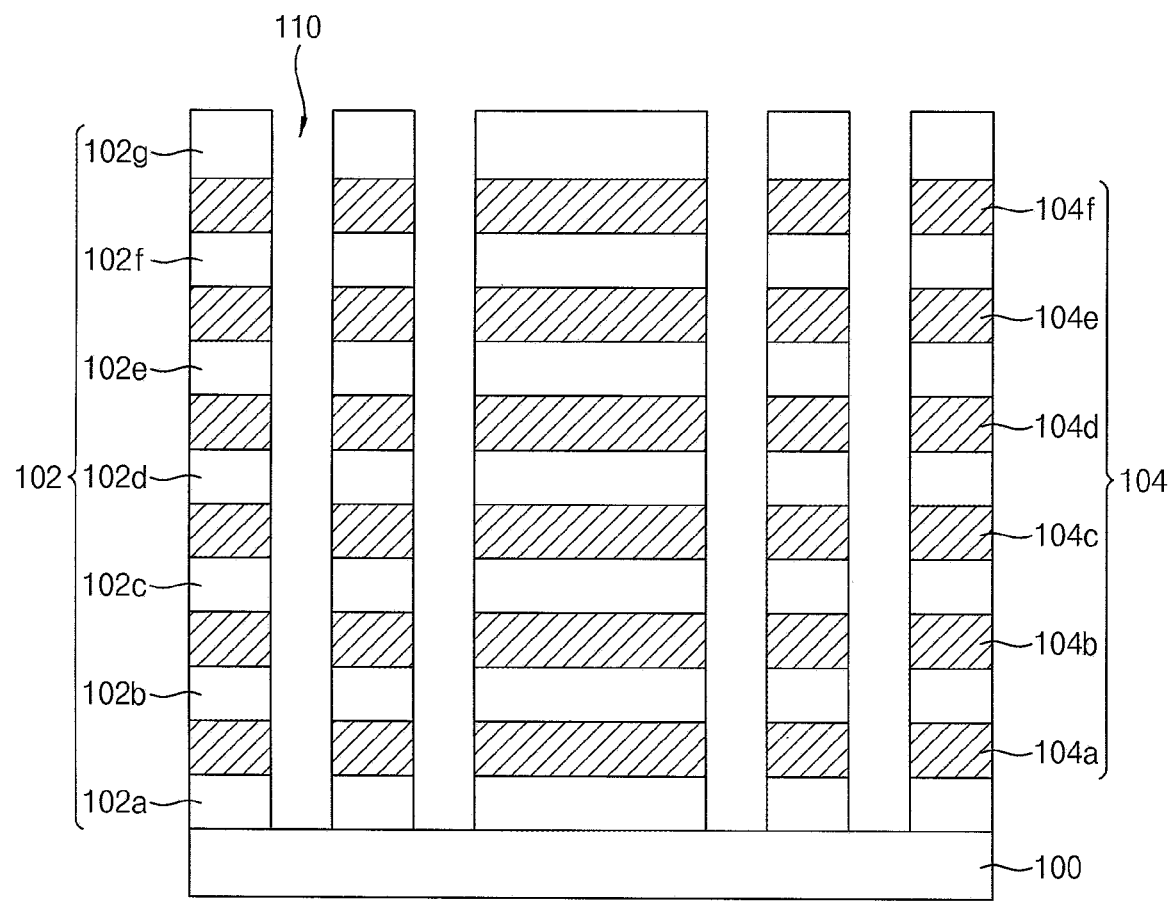
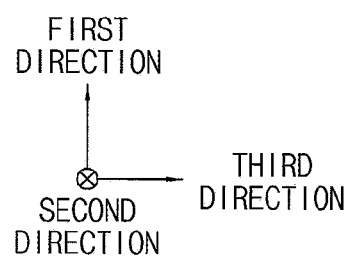

FIG. 8
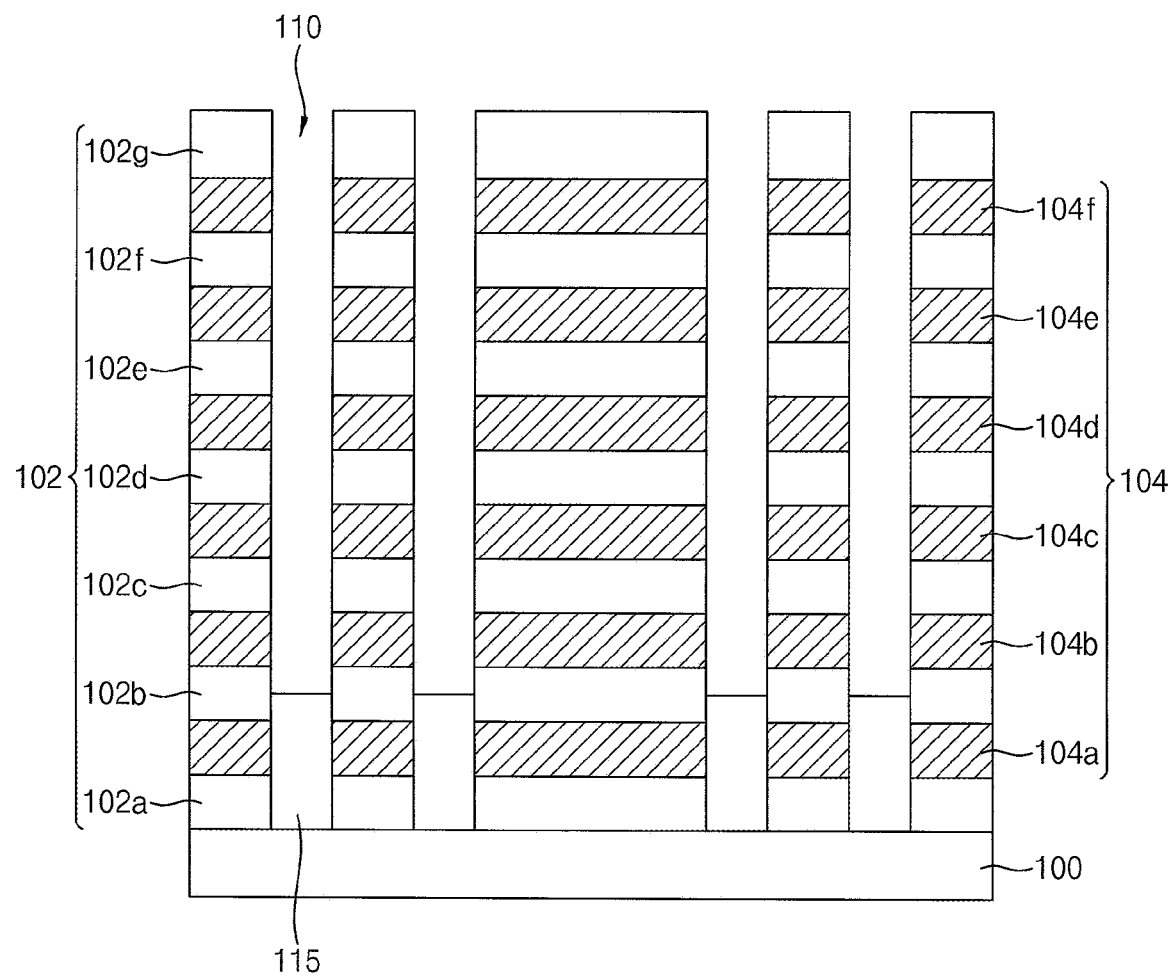
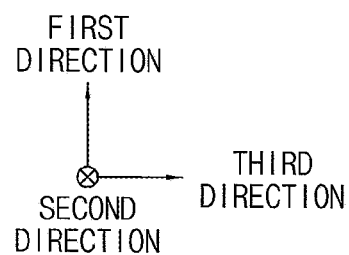

FIG. 9
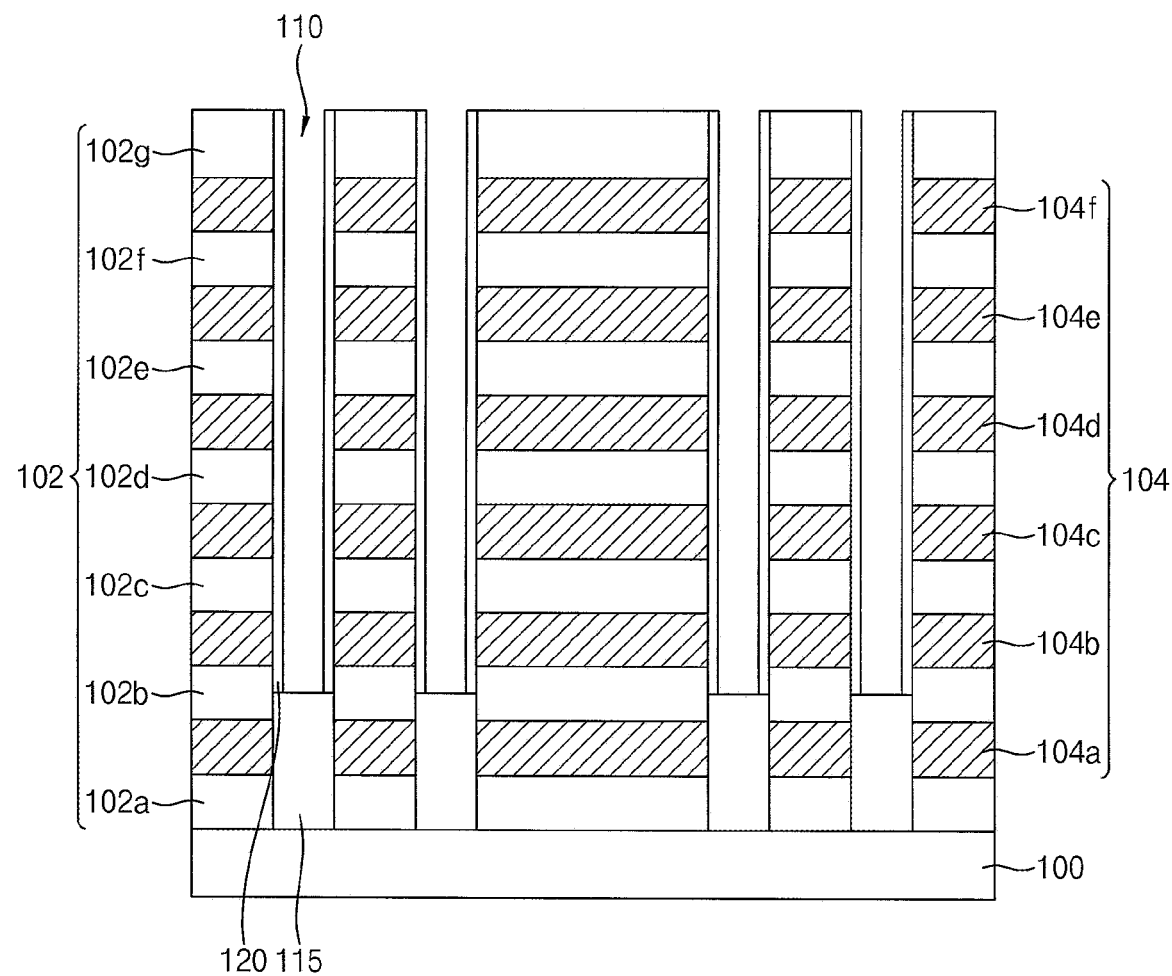
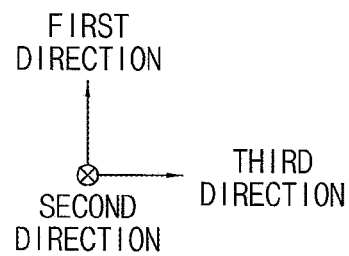

FIG. 22
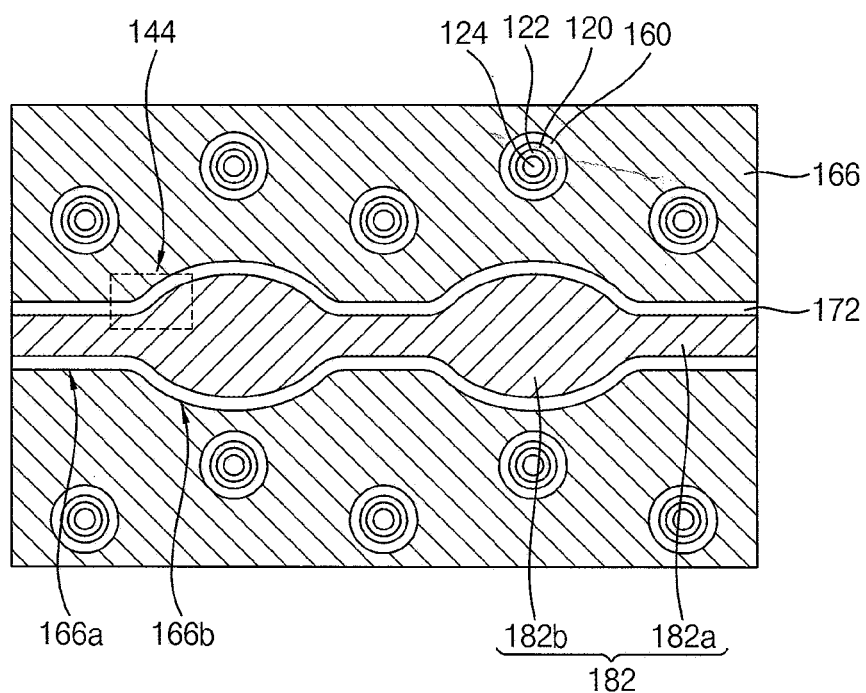
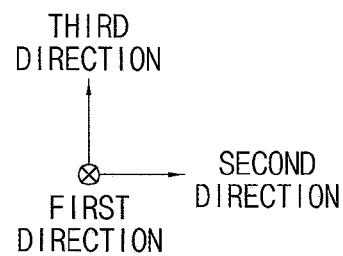

FIG. 23
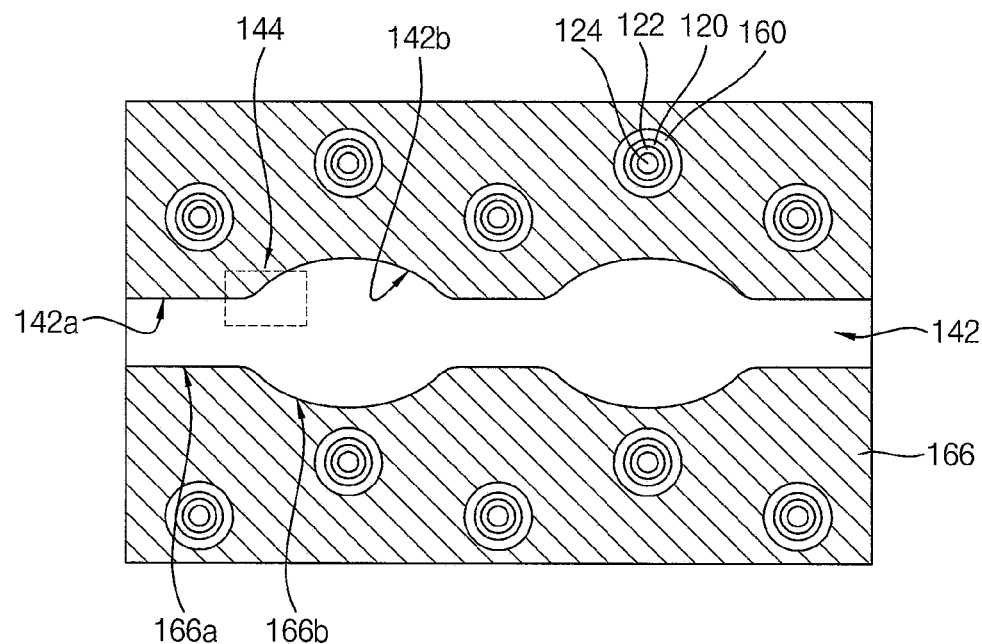
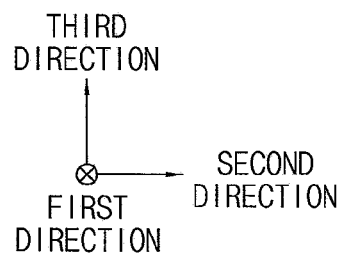

FIG. 24
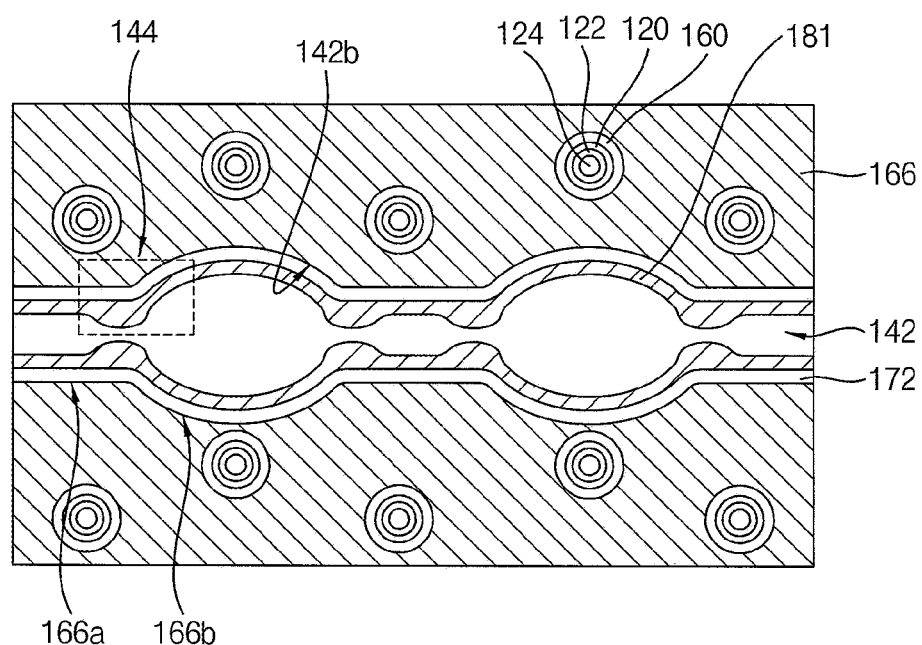
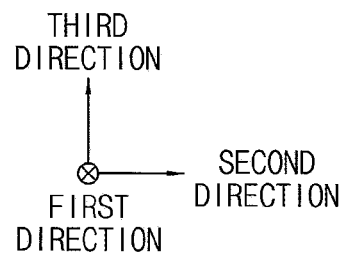

FIG. 25
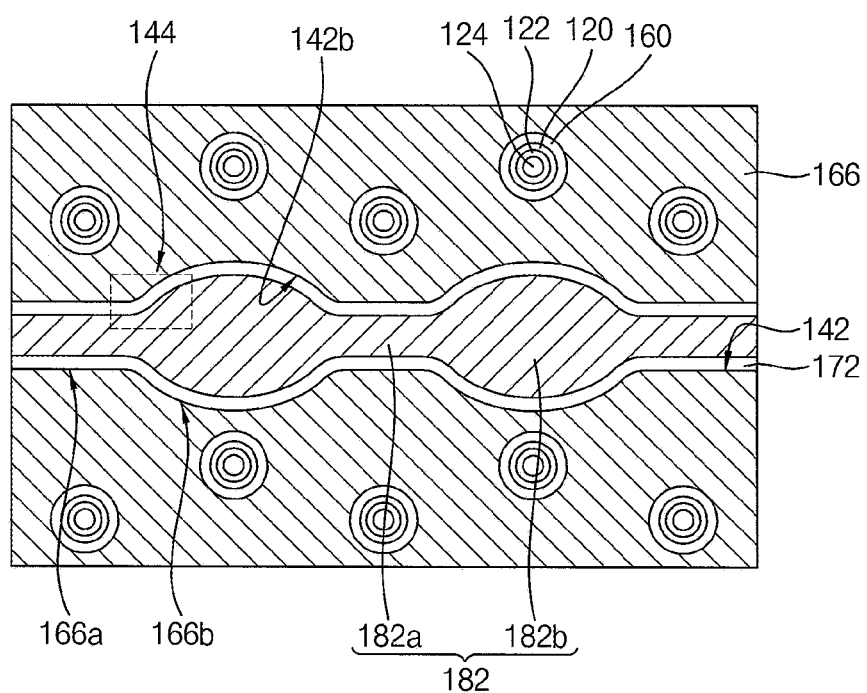
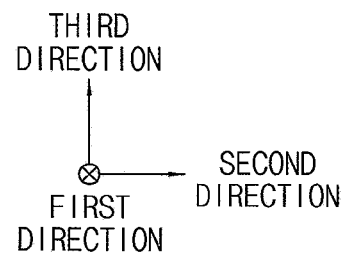

FIG. 26
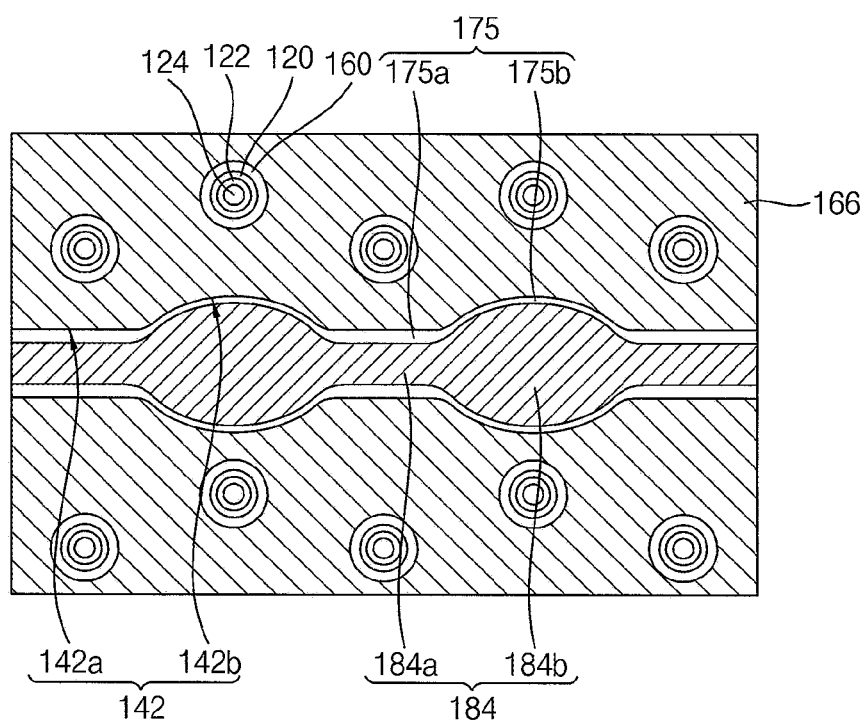
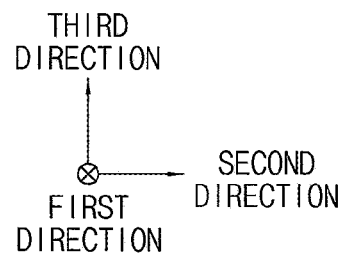

VERTICAL MEMORY DEVICES WITH COMMON SOURCE INCLUDING ALTERNATELY REPEATED PORTIONS HAVING DIFFERENT WIDTHS

CROSS-REFERENCE TO RELATED APPLICATION

This application is a continuation of U.S. Non-Provisional application Ser. No. 15/291,662, filed on Oct. 12, 2016, which claims priority under 35 USC § 119 to U.S. Provisional Application No. 62/240,660 filed on Oct. 13, 2015 in the USPTO, and Korean Patent Application No. 10-2015-0185178 filed on Dec. 23, 2015 in the Korean Intellectual Property Office (KIPO). The entire contents of the above-referenced applications are incorporated by reference herein.

BACKGROUND

1. Field

Example embodiments relate to vertical memory devices. More particularly, example embodiments relate to vertical memory devices including vertically stacked gate lines.

2. Description of Related Art

Recently, a vertical memory device including a plurality of memory cells stacked vertically with respect to a surface of a substrate has been developed for achieving a high degree of integration. In the vertical memory device, a channel having a pillar shape or a cylindrical shape may protrude vertically from the surface of the substrate, and gate lines surrounding the channel may be repeatedly stacked.

As the degree of integration of the vertical memory device becomes greater, the number of the gate lines, and the number of the channels may increase. Thus, structural and electrical reliability of various structures included in vertical memory device may not be easily achieved.

SUMMARY

Example embodiments provide a vertical memory device having improved mechanical and electrical reliability.

According to example embodiments, a vertical memory device may include a substrate, a plurality of channels on the substrate, a plurality of gate lines, and a conductive line. The channels extend in a first direction that is vertical to a top surface of the substrate. The gate lines are stacked on top of each other on the substrate. The gate lines surround the channels. The gate lines are spaced apart from each other along the first direction. The conductive line cuts the gate lines along the first direction. A width of the conductive line is periodically and repeatedly changed.

In example embodiments, the vertical memory device may include a plurality of conductive lines on the substrate. The conductive lines may include the conductive line. The conductive lines may extend in a second direction parallel to the top surface of the substrate. The conductive lines may be spaced apart from each other in a third direction that is parallel to the top surface of the substrate and crosses the second direction.

In example embodiments, the conductive lines may include a first portion and a second portion alternately repeated. A width of the second portions in the third direction may be greater than a width of the first portions in the third direction.

In example embodiments, the second portions in different conductive lines of the plurality among the conductive lines may be arranged in a staggered configuration or a zigzag configuration in a plan view.

In example embodiments, the first portions and the second portions included in the different conductive lines may face each other in the third direction.

In example embodiments, the second portion may have a rectangular cross-section in a plan view.

In example embodiments, the second portion may have an elliptical cross-section in a plan view.

In example embodiments, a boundary area between the first portions and the second portions may include a curved portion.

In example embodiments, the conductive lines may include at least one third portion configured as a pad.

In example embodiments, a width in the third direction of the third portion may be greater than a width in the third direction of the second portion.

In example embodiments, the third portions included in different conductive lines of the plurality of the conductive lines may be staggered along the third direction in a plan view.

In example embodiments, the third portion and the second portions may have different shape in a plan view.

In example embodiments, the vertical memory device may further include an insulation spacer formed along a sidewall of the conductive line.

In example embodiments, a thickness of a portion of the insulation spacer that contacts the first portions may be greater than a thickness of a portion of the insulation spacer that contacts the second portions.

According to example embodiments, a vertical memory device may include a substrate, a plurality of cell blocks on the substrate, and a conductive line on the substrate. A cell block among the plurality of the cell blocks includes a plurality of channels extending in a first direction vertical to a top surface of the substrate, and a plurality of gate lines stacked on top of each other on the substrate. The gate lines surround the channels. The gate lines are spaced apart from each other along the first direction. The conductive line includes a plurality of embossed patterns. The conductive line extends between two of the cell blocks.

In example embodiments, the cell block may further include insulating interlayer patterns formed between the gate lines. An uppermost insulating interlayer pattern of the insulating interlayer patterns may be on an uppermost gate line of the gate lines. The conductive line may extend in the first direction through the insulating interlayer patterns and the gate lines.

In example embodiments, an upper portion of the substrate may include an impurity region. The conductive line may be electrically connected to the impurity region, and may be a common source line (CSL).

In example embodiments, the vertical memory device may include a plurality of conductive lines on the substrate. The plurality of conductive lines may include the conductive line. The conductive lines may extend in a second direction parallel to the top surface of the substrate. The conductive lines may be arranged in a third direction that is parallel to the top surface of the substrate. The third direction may cross the second direction.

In example embodiments, the channels may be arranged in rows that are separated in the third direction. The channels in a same row may be spaced apart from each other in the second direction. A plurality of the rows of channels may be between each two conductive lines neighbor each other in the third direction.

In example embodiments, the embossed patterns may be spaced apart from each other along the second direction.

In example embodiments, the vertical memory device may further include an insulation spacer formed along a sidewall of the conductive line. A portion of the insulation spacer adjacent to end portions of the embossed patterns may include a convex surface.

According to example embodiments, a vertical memory device may include a substrate including a cell region, an extension region and a peripheral region, channels on the cell region of the substrate, gate lines stacked on top of each other in the first direction on the substrate, a conductive line on the substrate, first contacts, first wirings, and a second wiring. The channels extend in a first direction vertical to a top surface of the substrate. The gate lines surround the channels. The gate lines extend in a second direction parallel to the top surface of the substrate over the cell region and the extension region. The conductive line cuts the gate lines along the first direction. The conductive line extends in the second direction over the cell region and the extension region. The conductive line includes first portions and second portions that have different widths in a third direction. The third direction is perpendicular to the second direction and parallel to the top surface of the substrate. The first contacts electrically connect to the gate lines. The first contacts are arranged on the extension region. The first wirings electrically connect to the gate lines via the first contacts. The first wirings extend from the extension region to the peripheral region. The second wiring is electrically connected to the conductive line.

In example embodiments, the vertical memory device may further include a second contact that connects the second wiring to the conductive line.

In example embodiments, the conductive line may further include a third portion serving as a pad for the second contact.

In example embodiments, the first portions and the second portions may be on the cell region, and the third portion may be on the extension region.

In example embodiments, a width in the third direction of the third portion may be greater than each width in the third direction of the second portions and the first portions.

In example embodiments, the second wiring and the first wirings may be located at the same level.

In example embodiments, the vertical memory device may further include a bit line electrically connected to the channels on the cell region. The bit line may be located at the same level of the second wiring and the first wirings.

According to example embodiments, a vertical memory device may include a substrate, a plurality of channels on the substrate and extending in a vertical direction with respect to a top surface of the substrate, a plurality of gate lines stacked on top of each other on the substrate and surrounding the channels, and a conductive line on the substrate and cutting the gate lines along the vertical direction. The gate lines are spaced apart from each other along the vertical direction. Each of the gate lines includes protrusions and recessed portions that are alternately repeated.

In example embodiments, the conductive line may include first portions and second portions. The first portions may correspond to the protrusions of the gate lines. The second portions may correspond to the recessed portions of the gate lines. A volume of each of the second portions may be greater than a volume of each of the first portions.

In example embodiments, the first portions and the second portions may be alternately repeated in the conductive line.

In example embodiments, at least one of the second portions may be provided as a pad for a wiring interconnection.

According to example embodiments, a vertical memory device may include a substrate; cell blocks and conductive lines alternately arranged on the substrate in a plan view, each of the cell blocks including gate lines stacked on top of each other in a first direction and channels that extend in the first direction through the gate lines, the gate lines and conductive lines extending in a second direction that is parallel to a top of the substrate, the cell blocks and conductive lines alternately arranged in a third direction that crosses the second direction and is parallel to the top of the substrate, the conductive lines and gate lines being insulated from each other, the conductive lines including first and second portions that are alternately repeated in the second direction and have different widths in the third direction, respectively.

In example embodiments, the vertical memory device may further include insulation spacers on the substrate between the cell blocks and conductive lines.

In example embodiments, each of the cell blocks may include insulating interlayers alternately stacked with the gate lines, and dielectric layer structures that surround the channels and extend in the first direction over the substrate.

In example embodiments, an upper portion of the substrate may include an impurity region. The conductive lines may be electrically connected to the impurity region. The impurity region may be a common source line (CSL).

In example embodiments, a width of the gate lines in the third direction may periodically increase and decrease in the third direction as the gate lines extend in the second direction in the plan view.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIGS. 2A, 2B and 2C are cross-sectional views illustrating vertical memory devices in accordance with example embodiments;

FIGS. 5 to 20 are cross-sectional views and top plan views illustrating a method of manufacturing a vertical memory device in accordance with example embodiments;

FIG. 22 is a partially enlarged top plan view illustrating portions of a gate line and conductive lines in accordance with example embodiments;

FIGS. 23 to 25 are top plan views illustrating a process of forming a conductive line in accordance with example embodiments;

FIG. 26 is a partially enlarged top plan view illustrating portions of a gate line and conductive lines in accordance with some example embodiments;

DESCRIPTION OF EXAMPLE EMBODIMENTS

Figure 1:
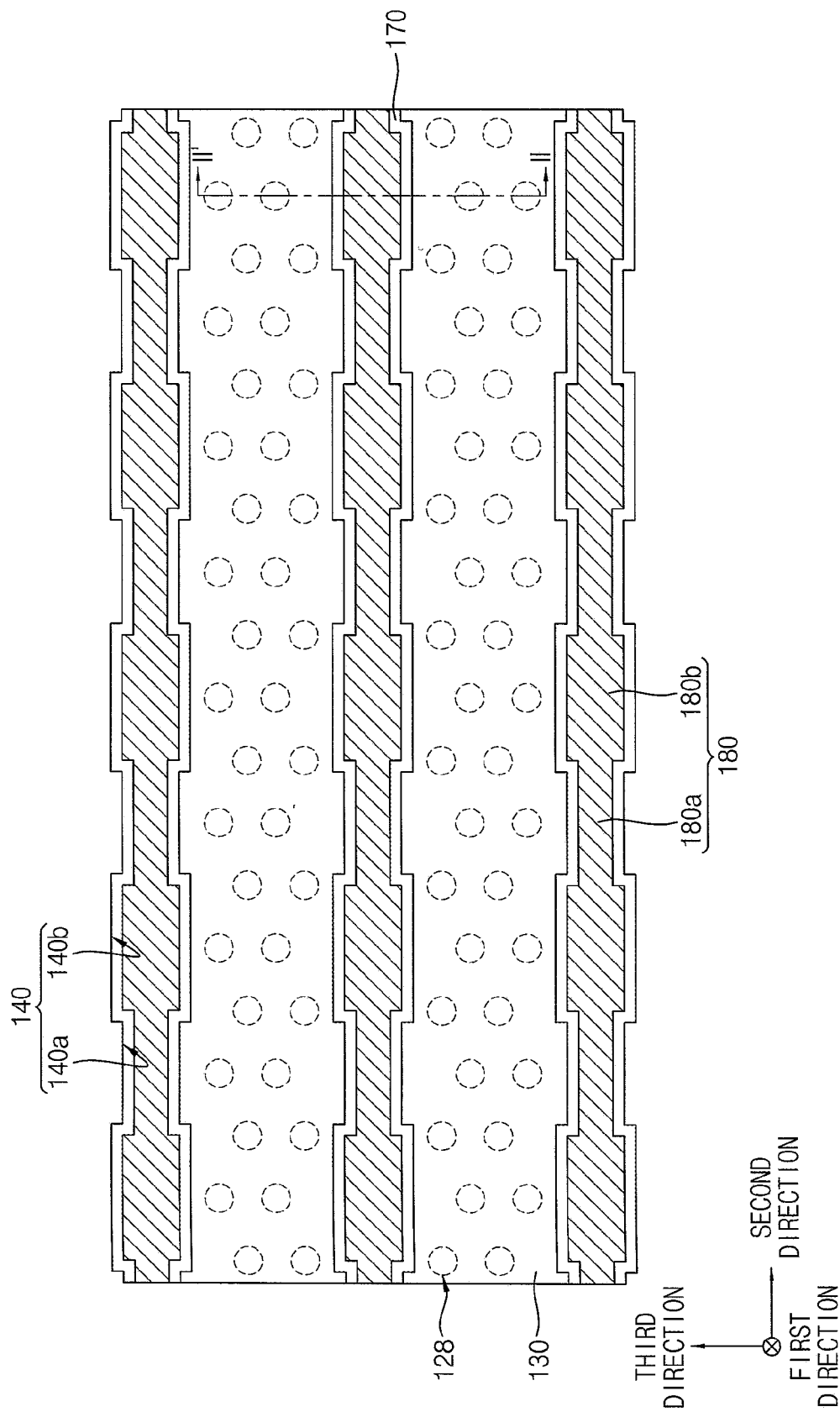
FIG. 1 is a top plan view illustrating a vertical memory device in accordance with example embodiments.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this description will be thorough and complete, and will fully convey the scope of inventive concepts to those skilled in the art. In the drawings, the sizes and relative sizes of layers and regions may be exaggerated for clarity. Like reference characters and/or numerals in the drawings denote like elements, and thus their description may not be repeated.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

A direction substantially vertical to a top surface of a substrate is referred to as a first direction, and two directions substantially parallel to the top surface of the substrate and crossing each other are referred to as a second direction and a third direction. For example, the second direction and the third direction are substantially perpendicular to each other. Additionally, a direction indicated by an arrow and a reverse direction thereof are considered as the same direction. The above mentioned definitions of the directions are the same throughout all the figures in this specification.

Figure 2A:
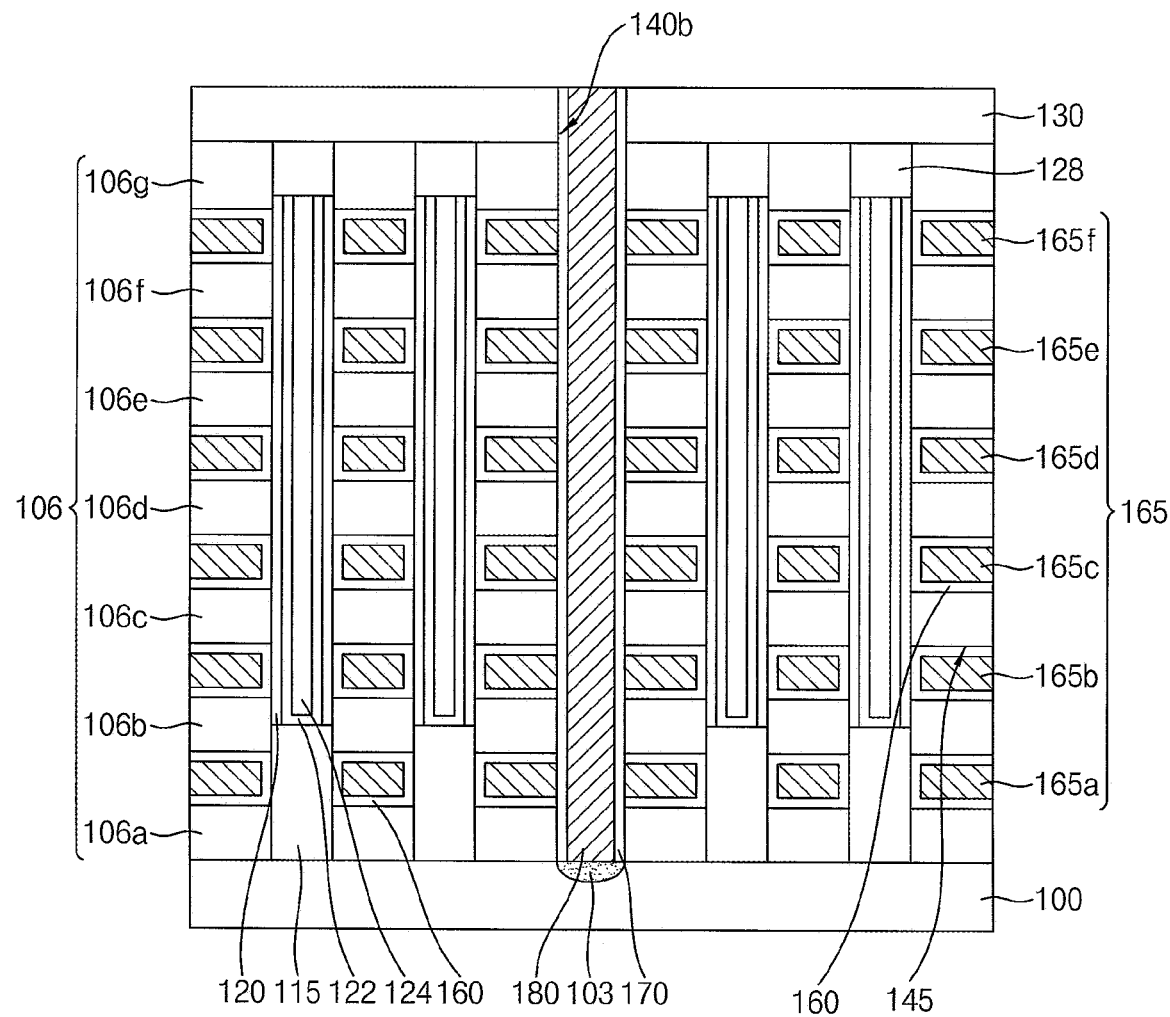
Figure 2C:
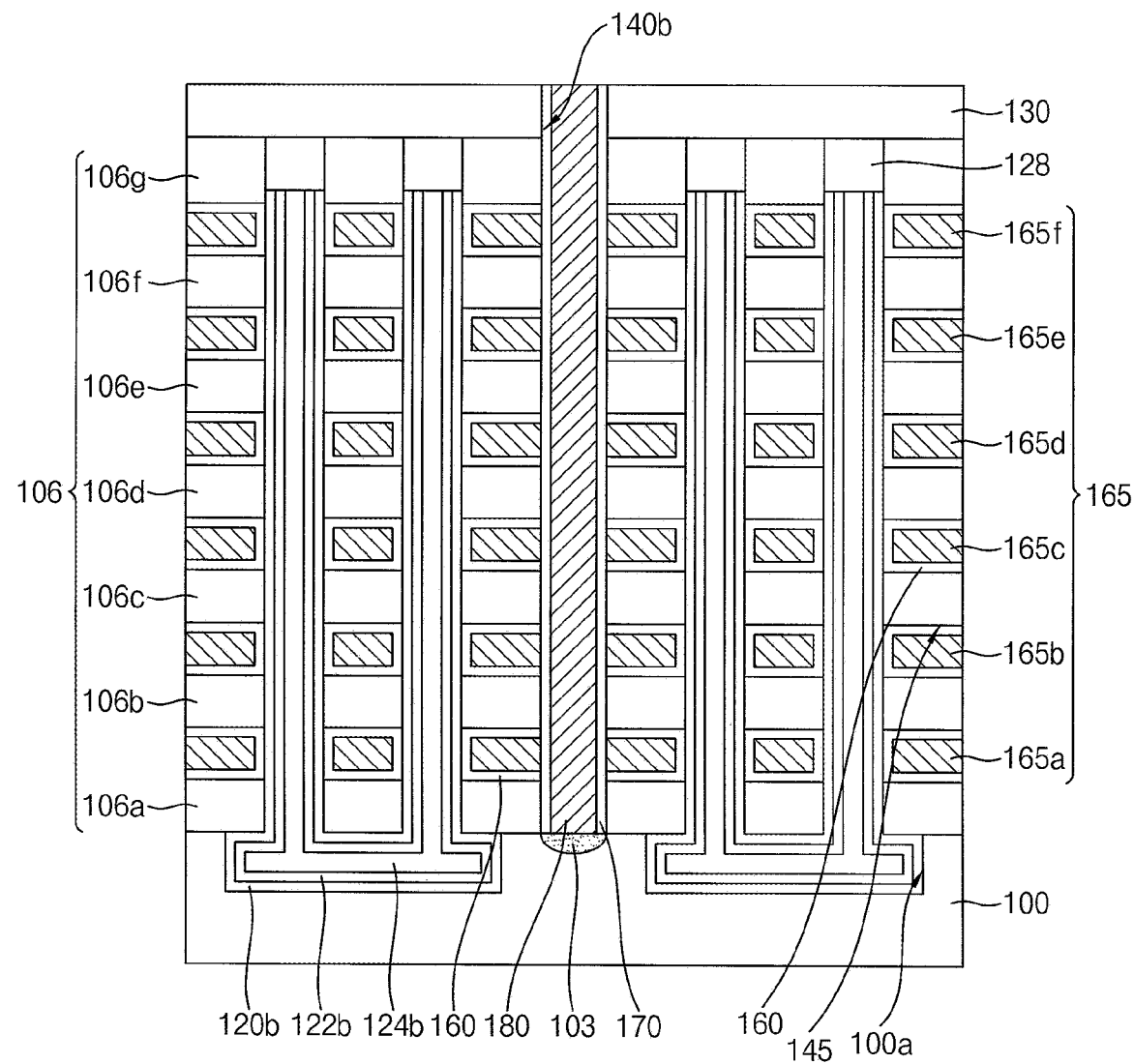

FIG. 1 is a top plan view illustrating a vertical memory device in accordance with example embodiments. FIGS. 2A, 2B and 2C are cross-sectional views illustrating vertical memory devices in accordance with example embodiments. For example, FIGS. 2A, 2B and 2C are cross-sectional views of vertical memory devices taken along a line II-II' indicated in FIG. 1 and along the first direction.

Referring to FIGS. 1 and 2A, in example embodiments, a vertical memory device may include a plurality of cell blocks separated by a conductive line 180. The cell block may include gate lines 165, insulating interlayer patterns 106, and a plurality of vertical channel structures extending through the gate lines 165 and the insulating interlayer patterns 106 along the first direction. The gate lines 165 and the insulating interlayer patterns 106 may be alternately and repeatedly stacked from a top surface of a substrate 100 along the first direction.

The substrate 100 may include a semiconductor material, e.g., silicon and/or germanium. In example embodiments, the substrate 100 may include single crystalline silicon. For example, the substrate 100 may serve as a body and/or a p-type well of the vertical memory device.

The vertical channel structure may extend through the gate lines 165 and insulating interlayer patterns 106 vertically from the top surface of the substrate. The vertical channel structure may include a channel 122, a dielectric layer structure 120 and a filling insulation pattern 124. In example embodiments, a semiconductor pattern 115 may be interposed between the substrate 100 and the vertical channel structure.

The channel 122 may have a hollow cylindrical shape or a cup shape. The channel 122 may include polysilicon or single crystalline silicon, and may include p-type impurities such as boron (B) in a portion thereof.

The filling insulation pattern 124 may fill an inner space of the channel 122, and may have a solid cylindrical shape or a pillar shape. The filling insulation pattern 124 may include an insulation material such as silicon oxide. In an embodiment, the channel 122 may have a pillar shape or a solid cylindrical shape, and the filling insulation pattern 124 may be omitted.

The dielectric layer structure 120 may be formed on an outer sidewall of the channel 122. The dielectric layer structure 120 may have a straw shape or a cylindrical shell shape.

The dielectric layer structure 120 may include a tunnel insulation layer, a charge storage layer and a blocking layer which may be sequentially stacked from the outer sidewall of the channel 122. The blocking layer may include silicon oxide or a metal oxide such as hafnium oxide or aluminum oxide. The charge storage layer may include a nitride such as silicon nitride or a metal oxide, and the tunnel insulation layer may include an oxide such as silicon oxide. For example, the dielectric layer structure 120 may have an oxide-nitride-oxide (ONO) layered structure.

The semiconductor pattern 115 may include single crystalline silicon or polysilicon. The semiconductor pattern 115 may be in contact with bottoms of the dielectric layer structure 120 and the channel 122.

A pad 128 may be formed on the vertical channel structure. For example, the pad 128 may be electrically connected to, e.g., a bit line, and may serve as a source/drain region through which charges may be moved or transferred to the channel 122. The pad 128 may include polysilicon or single crystalline silicon, and may be optionally doped with n-type impurities such as phosphorus (P) or arsenic (As).

As illustrated in FIG. 1, a plurality of the pads 128 may be arranged along the second direction such that a pad row may be defined, and a plurality of the pad rows may be arranged in the third direction. The vertical channel structures may be also arranged according to an arrangement of the pads 128. For example, a plurality of the vertical channel structures may be arranged along the second direction to form a channel row, and a plurality of the channel rows may be arranged in the third direction.

The gate lines 165 (e.g., 165a through 165f) may be formed on an outer sidewall of the dielectric layer structure 120 or the semiconductor pattern 115, and may be spaced apart from each other along the first direction. In example embodiments, each gate line 165 may partially surround the channels 122 or the vertical channel structures included in at least one of the channel rows, and may extend in the second direction.

The gate line 165 at each level may surround a desired (and/or alternatively predetermined) number of the channel rows, e.g., 4 channel rows as illustrated in FIG. 1.

The gate lines 165 may include a ground selection line (GSL), a word line and a string selection line (SSL). For example, a lowermost gate line 165a may serve as the GSL. An uppermost gate line 165f may serve as the SSL. The gate lines 165b to 165e between the GSL and the SSL may serve as the word lines.

The GSL (e.g., the gate line 165a) may laterally surround the semiconductor pattern 115. The word lines (e.g., the gate lines 165b to 165e) and the SSL (e.g., the gate line 165f) may laterally surround the vertical channel structure.

The gate lines 165 may be formed at increased levels in consideration of a circuit design and a degree of integration of the vertical memory device, e.g. 16 levels, 24 levels, 32 levels, 48 levels, etc. The SSLs may be formed at two or more levels.

The gate line 165 may include a metal such as tungsten (W), a metal nitride, a metal silicide and/or doped polysilicon. In example embodiments, the gate line 165 may have a multi-layered structure including a metal nitride such as tungsten nitride, and a metal.

The insulating interlayer patterns 106 (e.g., 106a through 106g) may be disposed between the gate lines 165 neighboring in the first direction. The insulating interlayer patterns 106 may include a silicon oxide-based material, e.g., silicon dioxide (SiO2), silicon oxycarbide (SiOC) or silicon oxyfluoride (SiOF). The gate lines 165 formed at different levels may be insulated from each other by the insulating interlayer patterns 106.

For example, a gap 145 may be defined between the insulating interlayer patterns 106 neighboring in the first direction, and the gate line 165 may be formed in the gap 145.

In example embodiments, an interface pattern 160 may be further formed on an inner wall of the gap 145 (e.g., an outer sidewall of the dielectric layer structure 120, and bottom and top surfaces of the neighboring insulating interlayer patterns 106). The interface pattern 160 may surround the gate line 165 in the gap 145.

For example, the interface pattern 160 may include a metal oxide such as aluminum oxide, and/or a metal nitride such as tungsten nitride, titanium nitride, tantalum nitride, or the like. The interface pattern 160 in contact with the lowermost gate line 165a may be formed on the sidewall of the semiconductor pattern 115, and may serve as a gate insulation layer.

A first upper insulation layer 130 may be formed on an uppermost insulating interlayer pattern 106g and the pads 128. The first upper insulation layer 130 may include, e.g., silicon-oxide based material.

The conductive line 180 may intersect or cut the first upper insulation layer 130, the gate lines 165 and the insulating interlayer patterns 106 along the first direction, and may extend in the second direction. An insulation spacer 170 may be formed on sidewalls of the conductive line 180, and may extend together with the conductive line 180.

The gate lines 165 and the insulating interlayer patterns 106 may be separated or cut by the conductive line 180 and the insulation spacer 170 such that a plurality of the cell blocks may be defined. The plurality of the cell blocks may be arranged along the third direction. As described above, each cell block may include the gate lines 165 and the insulating interlayer patterns 106 stacked from the top surface of the substrate 100, and may include a plurality of the vertical channel structures.

One of the cell blocks may include, e.g., four channel rows as illustrated in FIG. 1. Accordingly, the four channel rows may be disposed between the conductive lines 180 neighboring in the third direction.

In example embodiments, the conductive line 180 may include a first portion 180a and a second portion 180b which may have different widths (e.g., widths in the third direction). In example embodiments, a plurality of the first portions 180a and the second portions 180b may be alternately repeated along the second direction in one of the conductive lines 180.

In example embodiments, the second portion 180b may have the width greater than that of the first portion 180a, and the second portion 180b may have a volume greater than that of the first portion 180a. A width of the conductive line 180 may be periodically changed along the second direction due to the repeating arrangement of the first and second portions 180a and 180b.

In example embodiments, an opening 140 may be formed through the first upper insulation layer 130, the gate lines 165 and the insulating interlayer patterns 106 along the first direction. The opening 140 may extend in the second direction, and the top surface of the substrate 100 may be exposed through the opening 140. First openings 140a having a relatively narrow width and second openings 140b having a relatively large width may be alternately repeated in the opening 140.

An impurity region 103 doped with, e.g., n-type impurities may be formed at an upper portion of the substrate 100 exposed through the opening 140. The impurity region 103 may extend in, e.g., the second direction. The insulation spacer 170 may be formed on a sidewall of the opening 140. The conductive line 180 may fill a remaining portion of the opening 140, and may be electrically connected to the impurity region 103.

As described above, the width of the conductive line 180 may be repeatedly changed according to a shape of the opening 140. The first portion 180a of the conductive line 180 may be formed in the first opening 140a, and the second portion 180b of the conductive line 180 may be formed in the second opening 140b.

The conductive line 180 may include a metal, e.g., tungsten, aluminum, copper, etc. The conductive line 180 may serve as a common source line (CSL) of the vertical memory device. The insulation spacer 170 may include, e.g., a silicon-oxide based material.

According to example embodiments as described above, the conductive line 180 may include the second portions 180b having the expanded width or volume. Thus, areas or sites at which a metallic material may be adsorbed or attached may increase while performing a deposition process or a plating process for forming the conductive line 180. Therefore, defects such as voids, seams, cracks, etc., may be avoided in the conductive line 180, and structural and electrical reliability of the conductive line 180 may be improved. Further, an area or a volume of the conductive line 180 may be also increased by the second portions 180b so that an electrical resistance of the conductive line 180 may be reduced.

Referring to FIG. 2B, a semiconductor pattern may be omitted between the substrate 100 and a vertical channel structure, and the vertical channel structure may directly contact the top surface of the substrate 100.

In example embodiments, the vertical channel structure may include a dielectric layer structure 120a, a channel 122a and a filling insulation pattern 124a, and a bottom of the channel 122a mat directly contact the top surface of the substrate 100.

Referring to FIG. 2C, for example, a pair of the vertical channel structures may be connected to each other through an inside of the substrate 100.

In example embodiments, a trench 100a may be formed at an upper portion of the substrate 100. A dielectric layer structure 120b and a channel 122b included in the pair of the vertical channel structures may be continuously formed along a surface of the trench 100a. A filling insulation pattern 124b may be formed on the channel 122b to fill the trench 100a.

Figure 3:
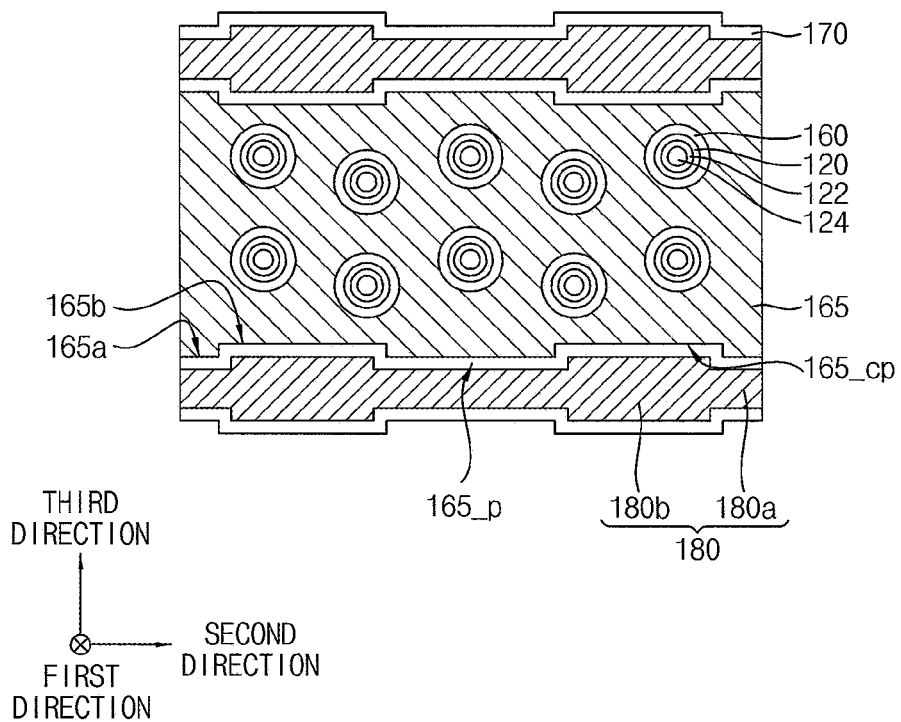
FIG. 3 is a partially enlarged top plan view illustrating portions of a gate line and conductive lines in accordance with example embodiments.
Figure 4:
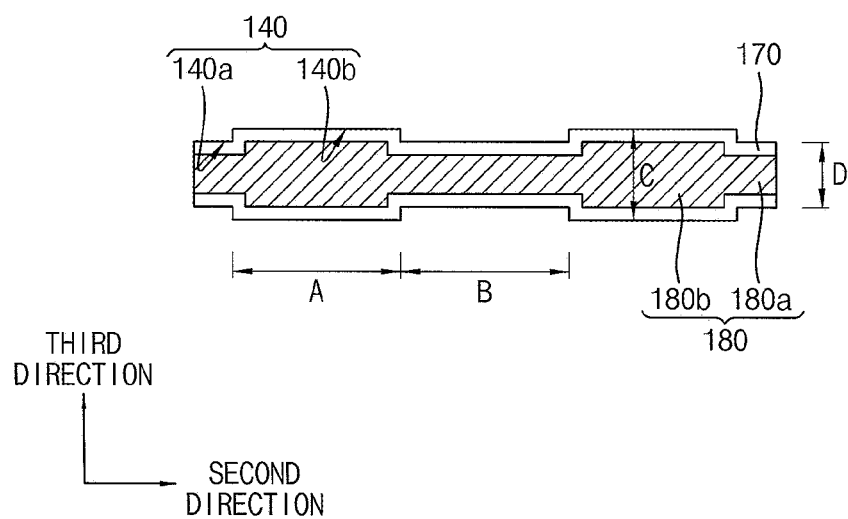
FIG. 4 is a partially enlarged top plan view illustrating a portion of a conductive line in accordance with example embodiments.

FIG. 3 is a partially enlarged top plan view illustrating portions of a gate line and conductive lines in accordance with example embodiments. FIG. 4 is a partially enlarged top plan view illustrating a portion of a conductive line in accordance with example embodiments;

Referring to FIGS. 3 and 4, as also described with reference to FIGS. 1 and 2, the gate line 165 may be interposed between the conductive lines 180 neighboring in the third direction. The gate line 165 may surround the vertical channel structure including the dielectric layer structure 120, the channel 122 and the filling insulation pattern 124, and may extend in the second direction. An outer sidewall of the vertical channel structure may be surrounded by the interface pattern 160.

The conductive line 180 may include the first portion 180a and the second portion 180b formed in the first opening 140a and the second opening 140b, respectively. The second portion 180b may be expanded in, e.g., the third direction from the first portion 180a. For example, the second portion 180b may have a rectangular shape in a plan view, and may be provided as a protruding pattern or an expanded pattern in the third direction.

According to constructions of the conductive line 180 or the opening 140 as described above, the gate line 165 may also have a structure in which an increase and decrease of a width may be repeated along the second direction. For example, as illustrated in FIG. 3, the gate line 165 may include a concave portion 165_cp corresponding to the second portion 180b of the conductive line 180, and a protrusion 165_p corresponding to the first portion 180a of the conductive line 180.

As illustrated in FIG. 4, a length of the second portion 180b (or a length of the second opening 140b) in the second direction may be designated as "A" and a length of the first portion 180*a* (or a length of the first opening 140*a*) may be designated as "B."

In example embodiments, A and B may be substantially the same. Accordingly, the length of the second portion 180*b* may be substantially the same as or similar to the length of the first portion 180*a*. For example, a ratio of A to B (A/B) may be in a range from about 0.9 to about 1.1.

For example, if the neighboring second portions 180*b* are excessively adjacent to each other, a deposition amount or a plating amount for forming the conductive line 180 may excessively increase. If the neighboring second portions 180*b* are excessively far from each other, defects such as voids, cracks may be generated in the first portion 180*a*.

Thus, according to example embodiments, the lengths of the first portion 180*a* and the second portion 180*b* may be adjusted to be substantially the same as or similar to each other so that a process efficiency may be improved while suppressing the defects in the conductive line 180.

A width of the second portion 180*b* (or a width of the second opening 140*b*) in the third direction may be designated as "C" and a width of the first portion 180*a* (or a width of the first opening 140*a*) may be designated as "D."

In example embodiments, a width ratio of the second portion 180*b* to the first portion (C/D) may be in a range from about 1.1 to about 1.3. If the width range is less than about 1.1, defects of the conductive line 180 may not be sufficiently prevented. If the width range is greater than about 1.3, the deposition amount or the plating amount for forming the conductive line 180 may excessively increase, and a space for forming the vertical channel structure may be reduced.

FIGS. 5 to 20 are cross-sectional views and top plan views illustrating a method of manufacturing a vertical memory device in accordance with example embodiments.

Specifically, FIGS. 6, 11, 13, 17 and 19 are top plan views illustrating the method. FIGS. 7, 12, 14, 18, and 20 are cross-sectional views taken along line VII-VII' of FIG. 6, line XII-XII' of FIG. 11, line XIV-XIV' of FIG. 13, line XVIII-XVIII' of FIG. 17, line XX-XX' of FIG. 19, respectively.

Referring to FIG. 5, insulating interlayers 102 (e.g., 102*a* through 102*g*) and sacrificial layers 104 (e.g., 104*a* through 104*f*) may be formed alternately and repeatedly on a substrate 100 to form a mold structure.

The insulating interlayer 102 may be formed of an oxide-based material, e.g., silicon dioxide, silicon oxycarbide and/or silicon oxyfluoride. The sacrificial layers 104 may be formed of a material that may have an etching selectivity with respect to the insulating interlayer 102 and may be easily removed by a wet etching process. For example, the sacrificial layers 104 may be formed of a nitride-based material, e.g., silicon nitride and/or silicon boronitride.

The insulating interlayers 102 and the sacrificial layers 104 may be formed by at least one of a chemical vapor deposition (CVD) process, a plasma enhanced chemical vapor deposition (PECVD) process, a high density plasma chemical vapor deposition (HDP-CVD) process, an atomic layer deposition (ALD) process or a sputtering process.

In an embodiment, a lowermost insulating interlayer 102*a* may be formed by a thermal oxidation process or a radical oxidation process on a top surface of the substrate 100. In an embodiment, an uppermost insulating interlayer 102*g* may have a relatively large thickness in consideration of a formation of a pad 128 (see FIG. 12).

The sacrificial layers 104 may be removed in a subsequent process to provide spaces for a GSL, a word line and an SSL.

Thus, the number of the insulating interlayers 102 and the sacrificial layers 104 may be determined in consideration of the number of the GSL, the word line and the SSL. FIG. 5 illustrates that the sacrificial layers 104 and the insulating interlayers 102 are formed at 6 levels and 7 levels, respectively. However, the number of the insulating interlayers 102 and the sacrificial layers 104 may be increased depending on a degree of integration of the vertical memory device.

Figure 6:
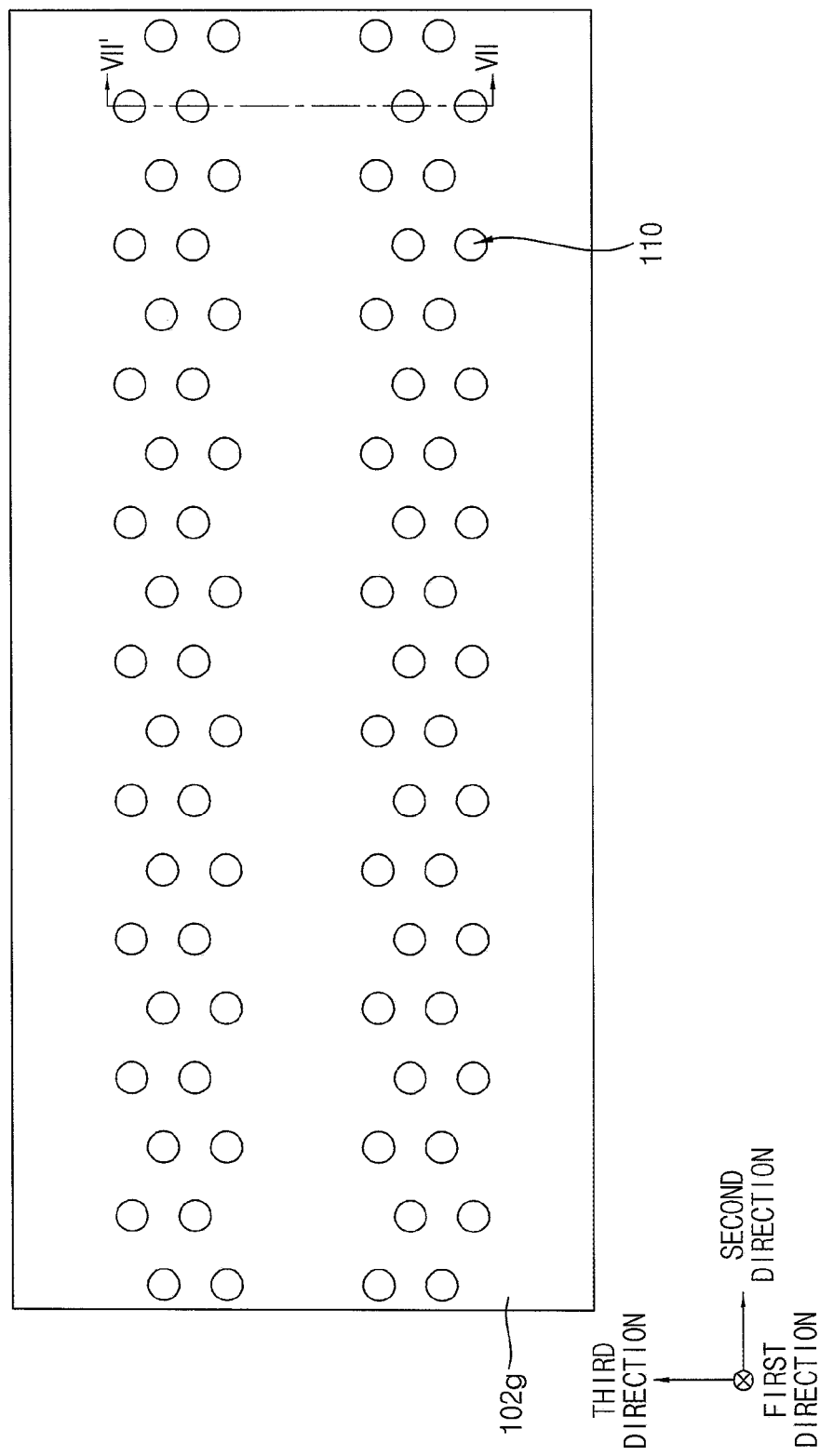

Referring to FIGS. 6 and 7, channel holes 110 may be formed through the mold structure.

For example, a hard mask (not illustrated) may be formed on an uppermost insulating interlayer 102*g*. The insulating interlayers 102 and the sacrificial layers 104 of the mold structure may be partially etched by performing, e.g., a dry etching process. The hard mask may be used as an etching mask to form the channel holes 110. The top surface of the substrate 100 may be partially exposed by the channel hole 110. The channel hole 110 may extend in the first direction from the top surface of the substrate 100.

The hard mask may be formed of silicon-based or carbon-based spin-on hardmask (SOH) materials, and/or a photoresist material. The hard mask may be removed by an ashing process and/or a strip process after the formation of the channel holes 110.

As illustrated in FIG. 6, a plurality of the channel holes 110 may be formed in the second direction to form a channel hole row. A plurality of the channel hole rows may be formed in the third direction. The channel hole rows may be arranged such that the channel holes 110 may be formed in a zigzag arrangement along the second direction and/or the third direction.

Referring to FIG. 8, a semiconductor pattern 115 filling a lower portion of the channel hole 110 may be formed.

In example embodiments, the semiconductor pattern 115 may be formed by a selective epitaxial growth (SEG) process using the top surface of the substrate 100 exposed through the channel hole 110 as a seed. In example embodiments, a top surface of the semiconductor pattern 115 may be located between a top surface of a first sacrificial layer 104*a* and a bottom surface of a second sacrificial layer 104*b*.

Referring to FIG. 9, a dielectric layer structure 120 may be formed on a sidewall of the channel hole 110.

For example, a dielectric layer may be formed along a top surface of the uppermost insulating interlayer 102*g*, the sidewalls of the channel holes 110 and the top surfaces of the semiconductor patterns 115. Portions of the dielectric layer formed on the top surfaces of the uppermost insulating interlayer 102*g* and the semiconductor pattern 115 may be removed by, e.g., an etch-back process. Accordingly, the dielectric layer structure 120 having, e.g., a straw shape or a cylindrical shell shape may be formed on the sidewall of the channel hole 110 from a remaining portion of the dielectric layer.

The dielectric layer may be formed by sequentially forming a blocking layer, a charge storage layer and a tunnel insulation layer. In example embodiments, the dielectric layer may be formed as an ONO layered structure. The blocking layer, the charge storage layer and the tunnel insulation layer may be formed by a CVD process, a PECVD process, an ALD process, etc.

Figure 10:
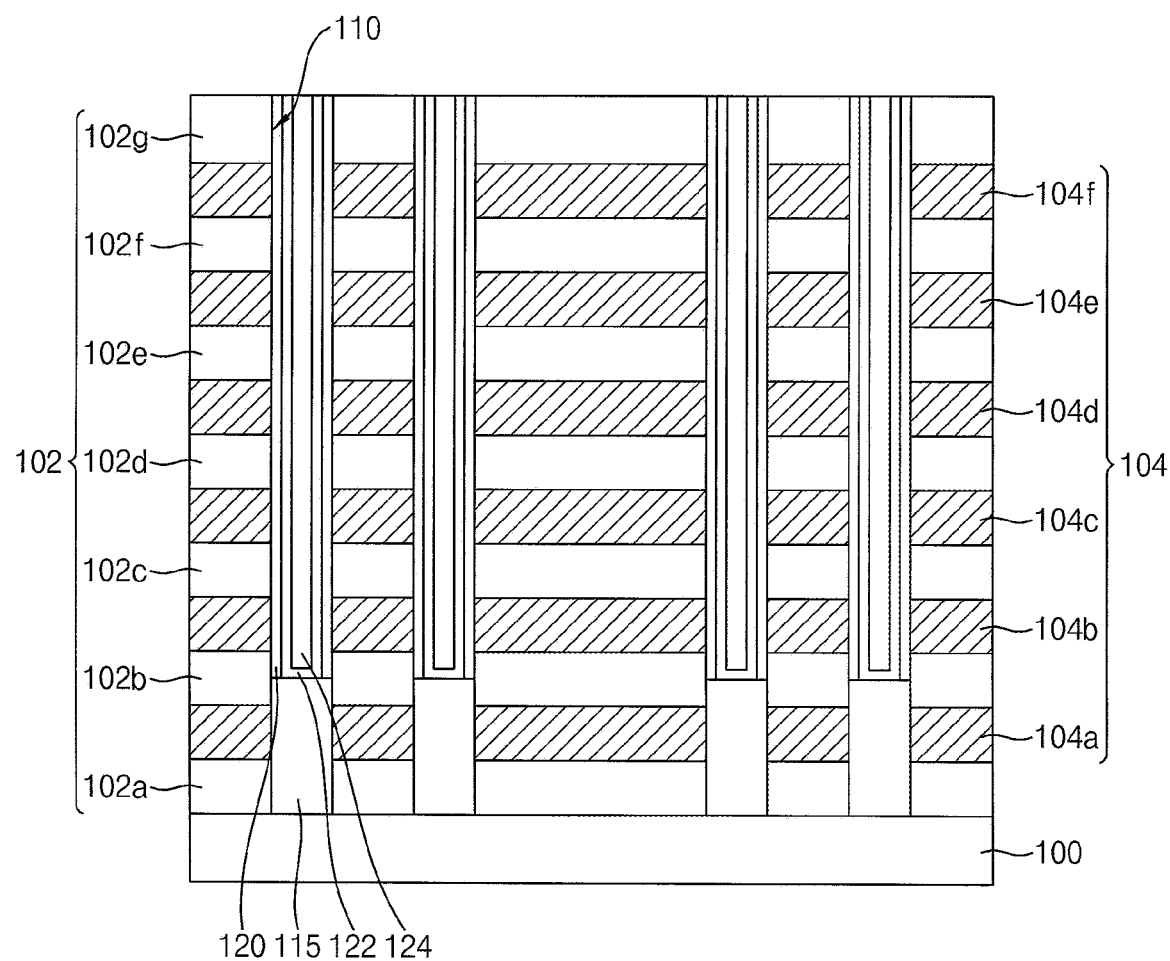

Referring to FIG. 10, a channel 122 and a filling insulation pattern 124 filling a remaining portion of the channel hole 110 may be formed.

In example embodiments, a channel layer and a filling insulation layer filling the remaining portion of the channel hole 110 may be sequentially formed along a top surface of the uppermost insulating interlayer 102*g*, an inner wall of the dielectric layer structure 120 and the top surface of the semiconductor pattern 115. Upper portions of the channel layer and the filling insulation layer may be planarized by, e.g., a chemical mechanical polish (CMP) process until the top surface of the uppermost insulating interlayer 102g may be exposed. Accordingly, a vertical channel structure including the dielectric layer structure 120, the channel 122 and the filling insulation pattern 124 that may be sequentially stacked in the channel hole 110 may be formed on the semiconductor pattern 115.

The channel layer may be formed of polysilicon or amorphous silicon which is optionally doped with impurities. In an embodiment, a heat treatment or a laser beam irradiation may be further performed on the channel layer. In this case, the channel layer may be transformed to include single crystalline silicon. The filling insulation layer may be formed using, e.g., silicon oxide or silicon nitride. The channel layer and the filling insulation layer may be formed by a CVD process, a PECVD process, an ALD process, a PVD process, a sputtering process, etc.

For example, the channel 122 may have a substantially cup shape, and the filling insulation pattern 124 may have a pillar shape inserted in the channel 122.

Figure 11:
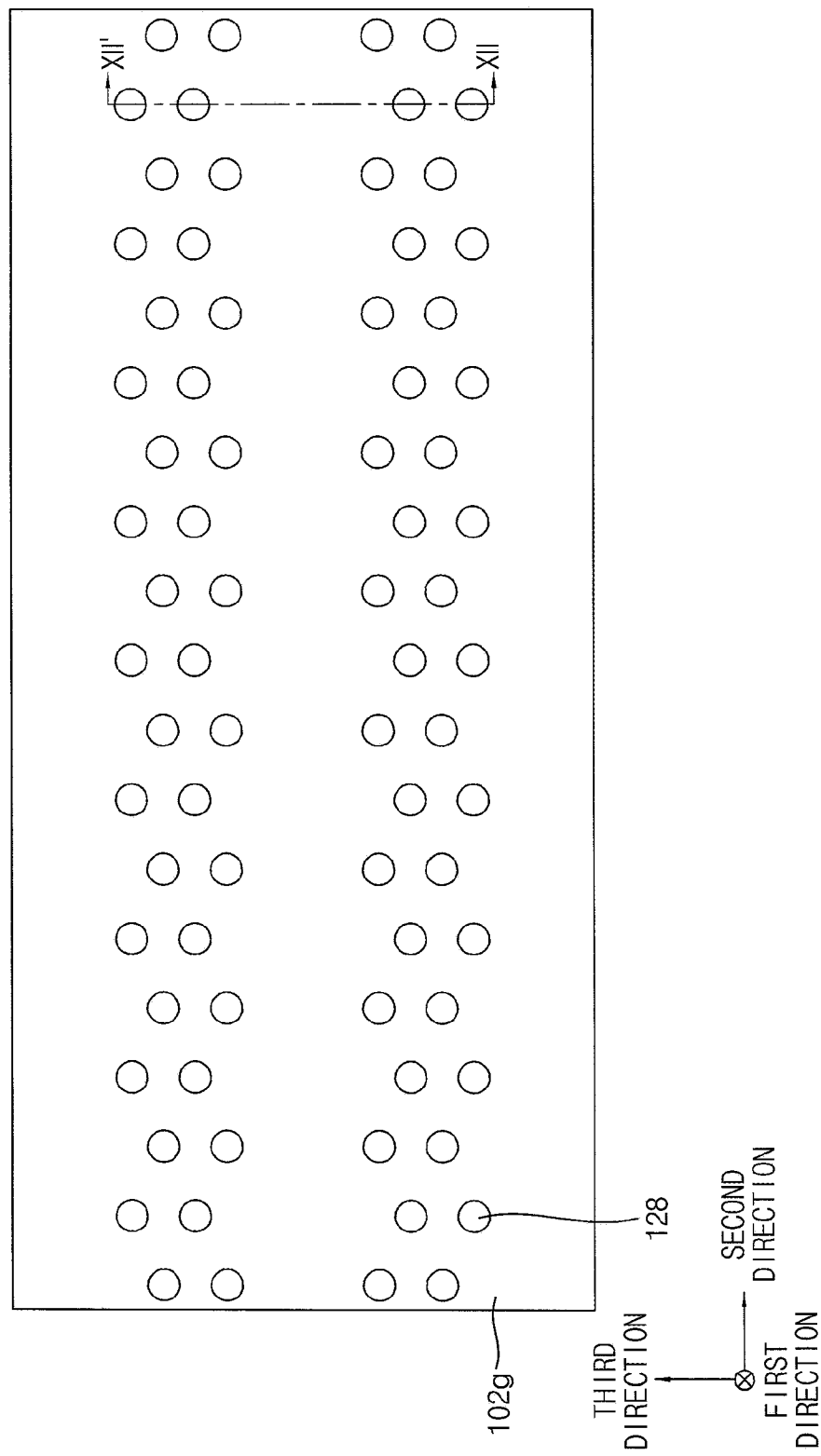
Figure 12:
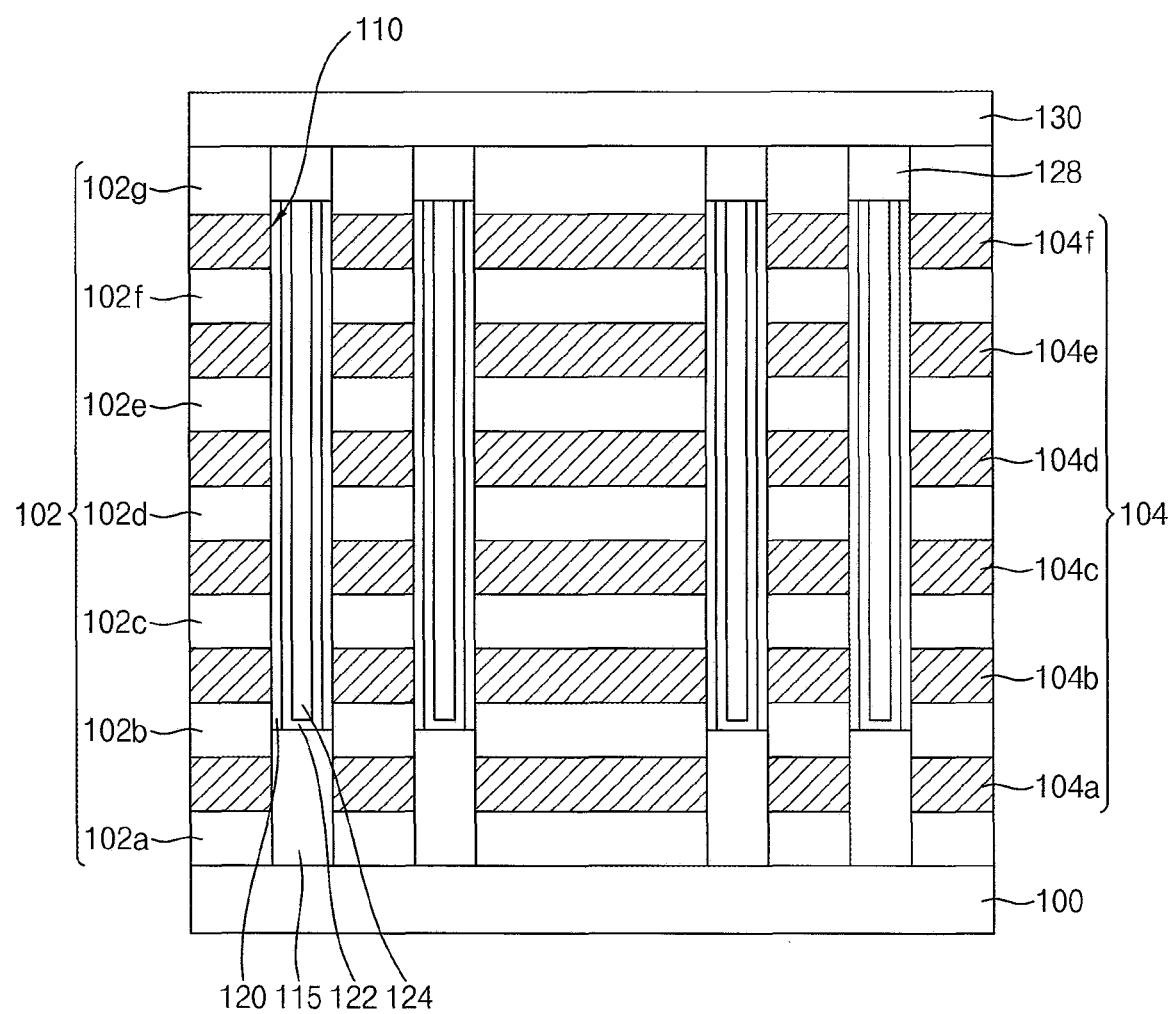

Referring to FIGS. 11 and 12, the pad 128 capping the channel hole 110 may be formed.

For example, an upper portion of the vertical channel structure may be partially removed by, e.g., an etch-back process to form a recess. A pad layer may be formed on the dielectric layer structure 120, the channel 122, the filling insulation pattern 124 and the uppermost insulating interlayer 102g to sufficiently fill the recess. An upper portion of the pad layer may be planarized by, e.g., a CMP process until the top surface of the uppermost insulating interlayer 102g may be exposed to form the pad 128.

The pad layer may be formed using polysilicon optionally doped with n-type impurities by a sputtering process or an ALD process. In an embodiment, a preliminary pad layer including amorphous silicon may be formed, and then a crystallization process may be performed thereon to form the pad layer.

According to the arrangement of the channel hole rows as described above, a plurality of the pads 128 may be arranged along the second direction to define a pad row in the uppermost insulating interlayer 102g. Further, a channel row may be defined under the pad row, and a plurality of the channel rows may be arranged along the third direction.

A first upper insulation layer 130 may be formed on the uppermost insulating interlayer 102g and the pads 128. The first upper insulation layer 130 may be formed of, e.g., silicon oxide by a CVD process, a spin coating process, etc.

Figure 13:
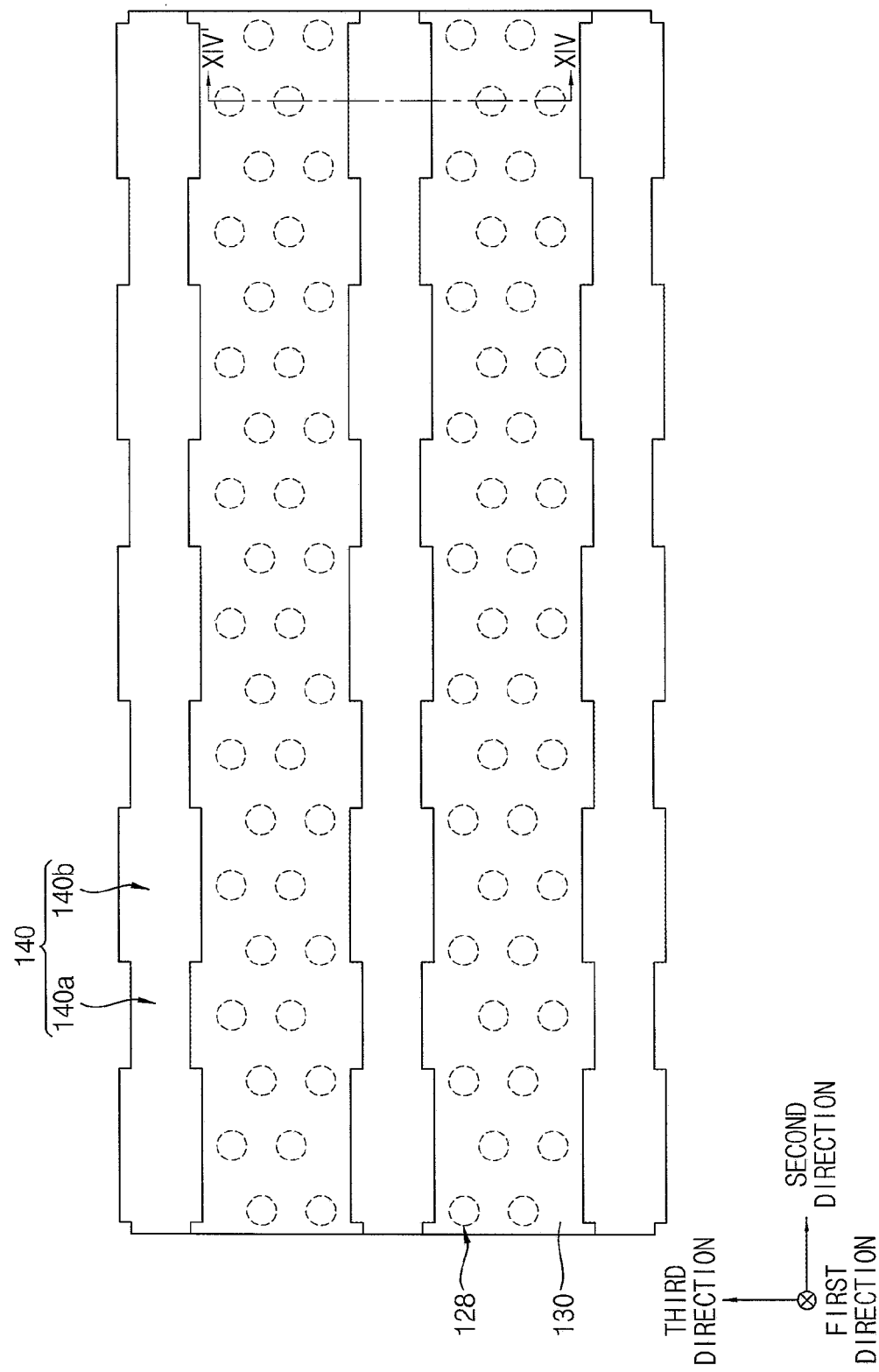
Figure 14:
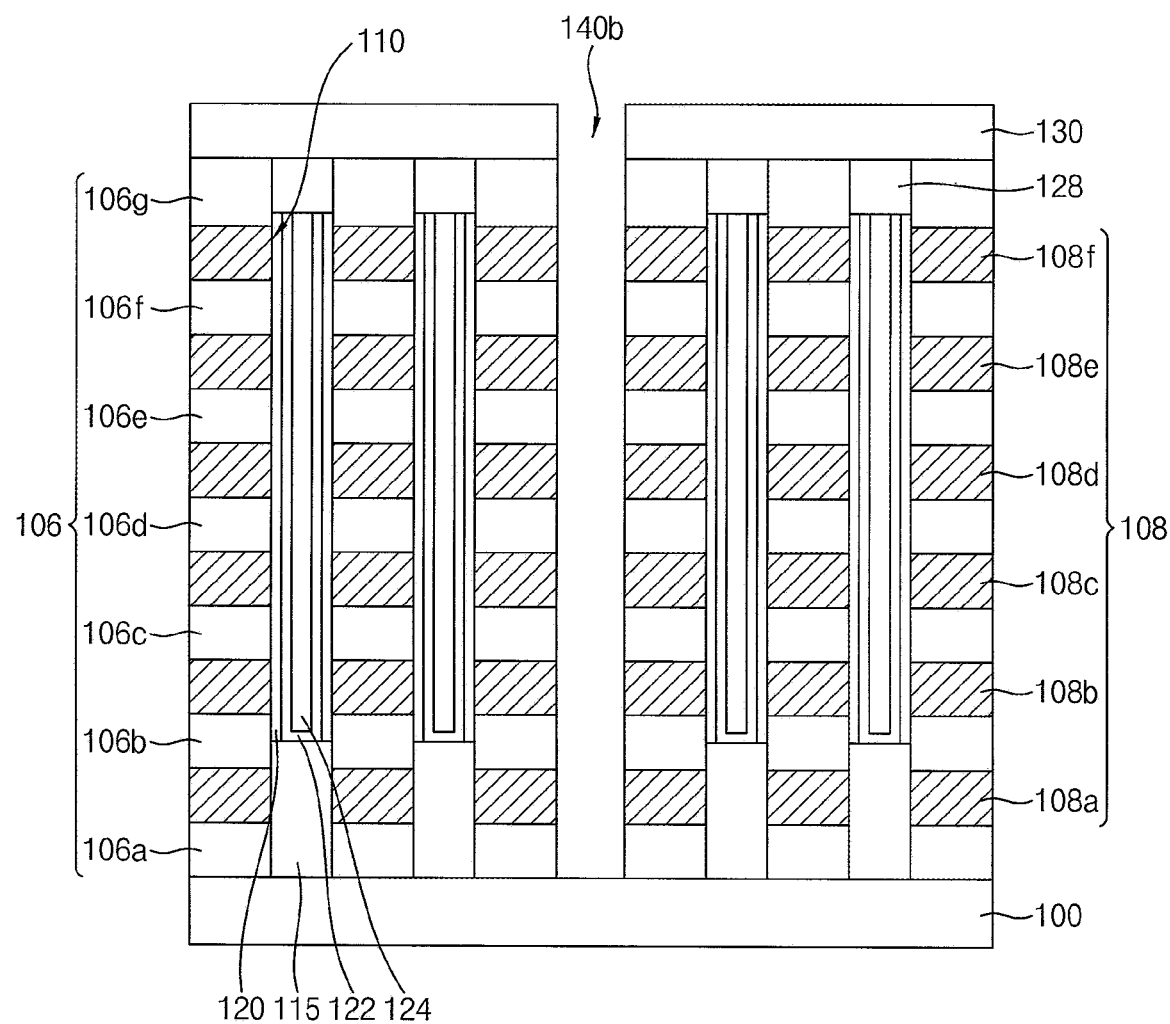

Referring to FIGS. 13 and 14, an opening 140 cutting the first upper insulation layer 130 and the mold structure may be formed.

For example, a hard mask (not illustrated) partially exposing the first upper insulation layer 130 between some of the channel rows neighboring in the third direction may be formed. The first upper insulation layer 130, the insulating interlayers 102 and the sacrificial layers 104 may be partially etched by, e.g., a dry etching process using the hard mask as an etching mask to form the opening 140. The hard mask may be formed using a photoresist material or an SOH material. The hard mask may be removed by an ashing process and/or a strip process after the formation of the opening 140.

The opening 140 may extend in the second direction, and a width (e.g., a width in the third direction) of the opening 140 may repeatedly increase and decrease. In example embodiments, the opening 140 may include a first opening 140a having a relatively narrow width and a second opening 140b having a relatively large width. A plurality of the first openings 140a and the second openings 140b may be alternately repeated along the second direction.

In example embodiments, the hard mask for the formation of the opening 140 may also include openings corresponding to the first opening 140a and the second opening 140b. In example embodiments, the second opening 140b may have a substantially rectangular shape in a plan view.

A plurality of the openings 140 may be formed along the third direction, and a desired (and/or alternatively predetermined) number of the channel rows may be arranged between the openings 140 neighboring in the third direction. For example, as illustrated in FIG. 13, four channel rows may be included between the neighboring openings 140. However, the number of the channel rows between the openings 140 may be properly adjusted in consideration of a circuit design or a degree of integration of the vertical memory device.

As illustrated in FIG. 14, after the formation of the opening 140, the insulating interlayers 102 and the sacrificial layers 104 may be changed into insulating interlayer patterns 106 (e.g., 106a through 106g) and sacrificial patterns 108 (e.g., 108a through 108f). The insulating interlayer pattern 106 and the sacrificial pattern 108 at each level may have a plate shape extending in the second direction.

In example embodiments, the top surface of the substrate 100, and sidewalls of the insulating interlayer patterns 106 and the sacrificial patterns 108 may be exposed through the opening 140.

Figure 15:
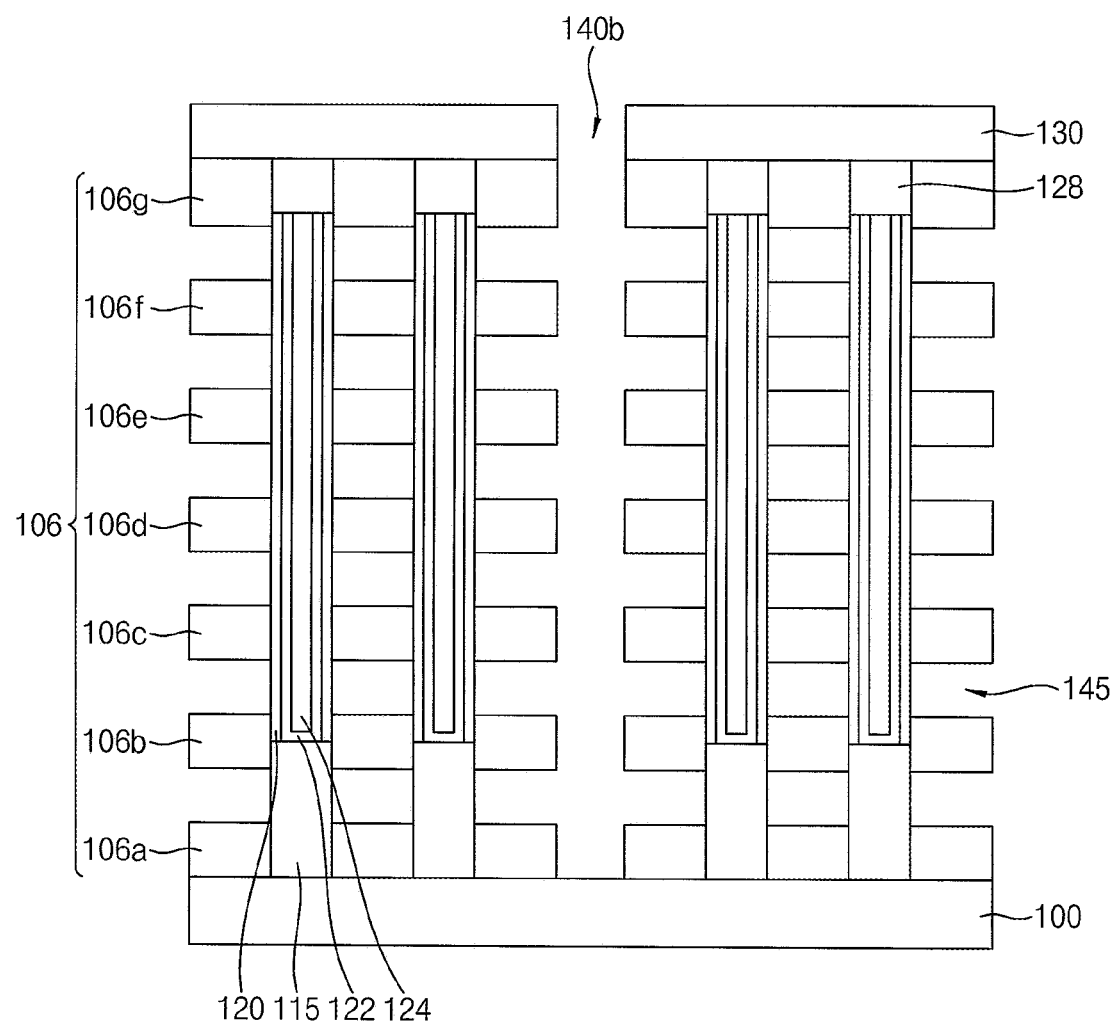

Referring to FIG. 15, the sacrificial patterns 108 exposed by the opening 140 may be removed. In example embodiments, the sacrificial patterns 108 may be removed by a wet etching process using, e.g., phosphoric acid as an etchant solution that may have an etching selectivity for silicon nitride.

A gap 145 may be defined by a space from which the sacrificial pattern 108 is removed between the insulating interlayer patterns 106 neighboring in the first direction. A sidewall of the vertical channel structure (e.g., a sidewall of the dielectric layer structure 120) may be partially exposed by the gap 145. In example embodiments, a sidewall of the semiconductor pattern 115 may be exposed by a lowermost gap 145.

Figure 16:
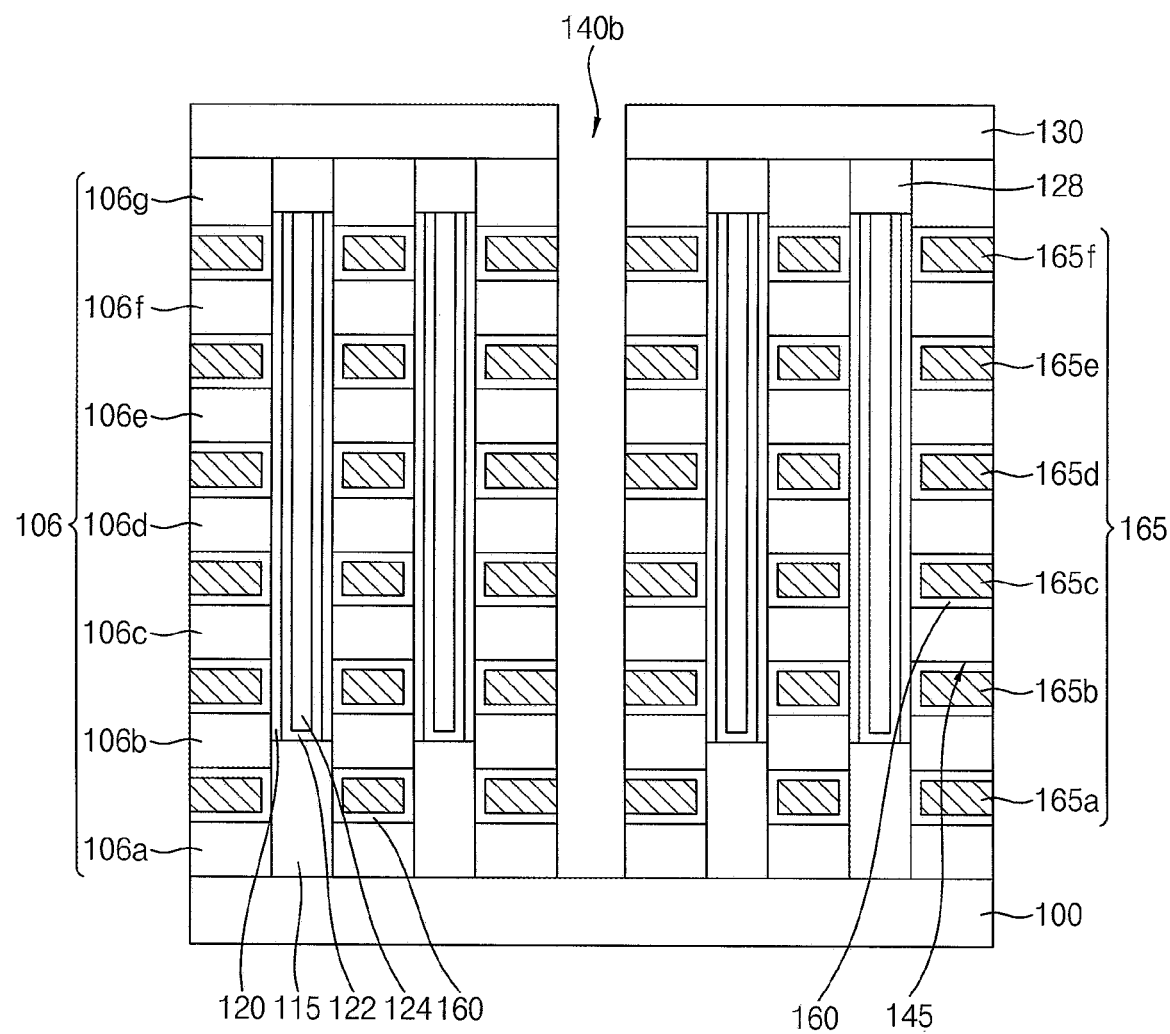

Referring to FIG. 16, an interface pattern 160 and a gate line 165 (e.g., 165a through 165o) may be formed in the gap 145 at each level. Accordingly, the sacrificial layer 104 or the sacrificial pattern 108 at each level may be replaced with the gate line 165.

In example embodiments, an interface layer may be formed along a top surface of the first upper insulation layer 130, the sidewall of the opening 140, and surfaces of the insulating interlayer patterns 106 and the dielectric layer structure 120 exposed by the gaps 145. The interface layer may be formed of a metal oxide and/or a metal nitride by an ALD process, a sputtering process, etc.

Subsequently, a gate electrode layer filling the gaps 145 and at least partially filling the opening 140 may be formed on the interface layer. The gate electrode layer may be also formed on the top surface of the first upper insulation layer 130.

The gate electrode layer may be formed using a metal or a metal nitride. For example, the gate electrode layer may be formed of a metal such as tungsten, aluminum, copper, titanium or tantalum, or a nitride of the metal. In an embodiment, the gate electrode layer may be formed as a multi-layered structure including a barrier layer formed of a metal nitride, and a metal layer. The gate electrode layer may be formed by a CVD process, a PECVD process, an ALD process, a PVD process, a sputtering process, etc.

The interface layer and the gate electrode layer may be partially removed to form the interface pattern 160 and the gate line 165 in the gap 145 at each level.

For example, upper portions of the gate electrode layer and the interface layer may be planarized by, e.g., a CMP process until the first upper insulation layer 130 may be exposed. Portions of the gate electrode layer and the interface layer formed in the opening 140 and on the top surface of the substrate 100 may be additionally etched to obtain the interface pattern 160 and the gate lines 165. The interface pattern 160 may at partially surround the gate line 165 in each gap 145, and may also surround the vertical channel structure or the semiconductor pattern 115.

The gate lines 165 may include the GSL (e.g., the gate line 165*a*), the word line (e.g., the gate lines 165*b* through 165*e*) and the SSL (e.g., the gate line 165*f*) sequentially stacked and spaced apart from one another in the first direction. The number of the levels at which the GSL, the word line and the SSL are formed may increase in consideration of a circuit design and a capacity of the vertical memory device.

Figure 17:
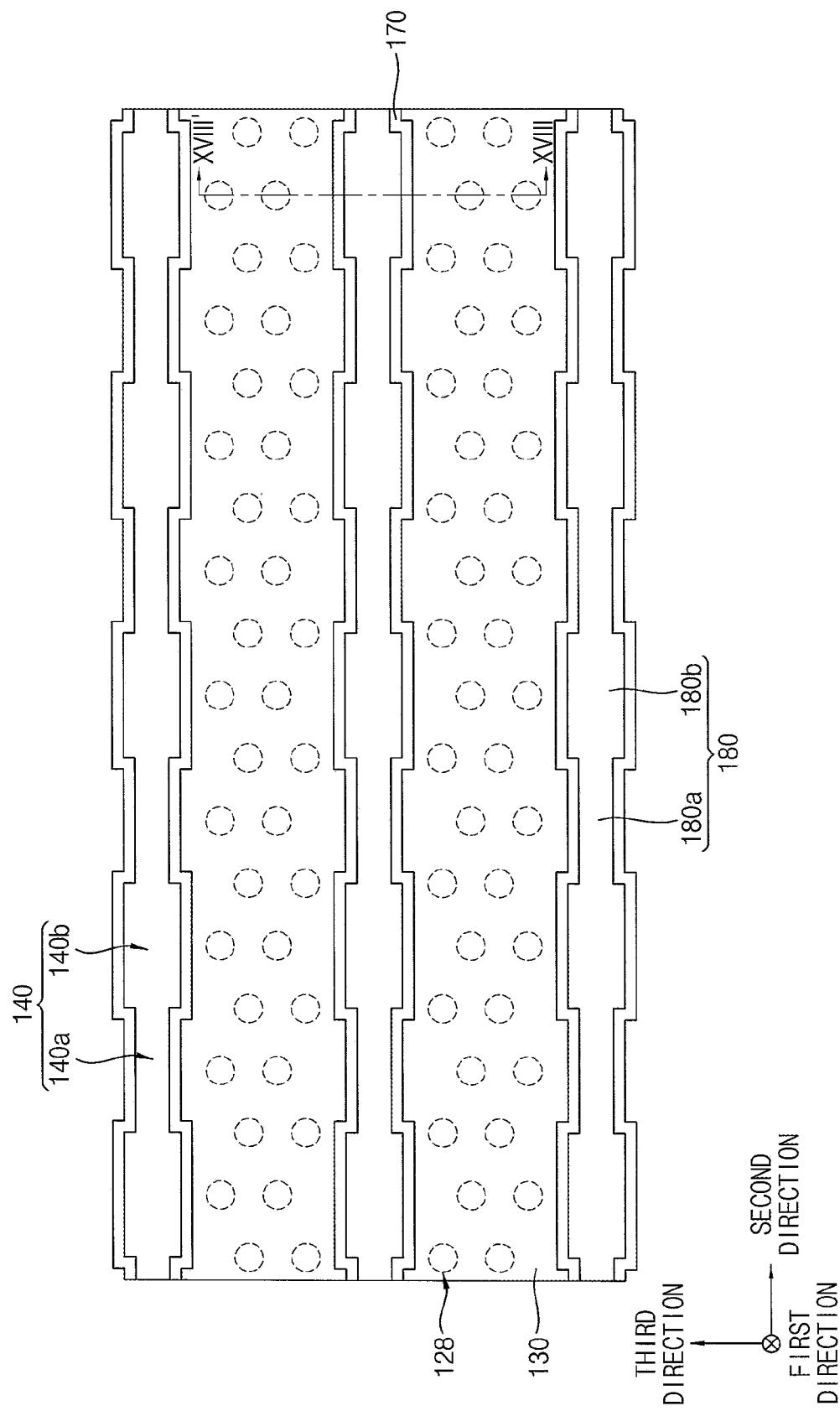
Figure 18:
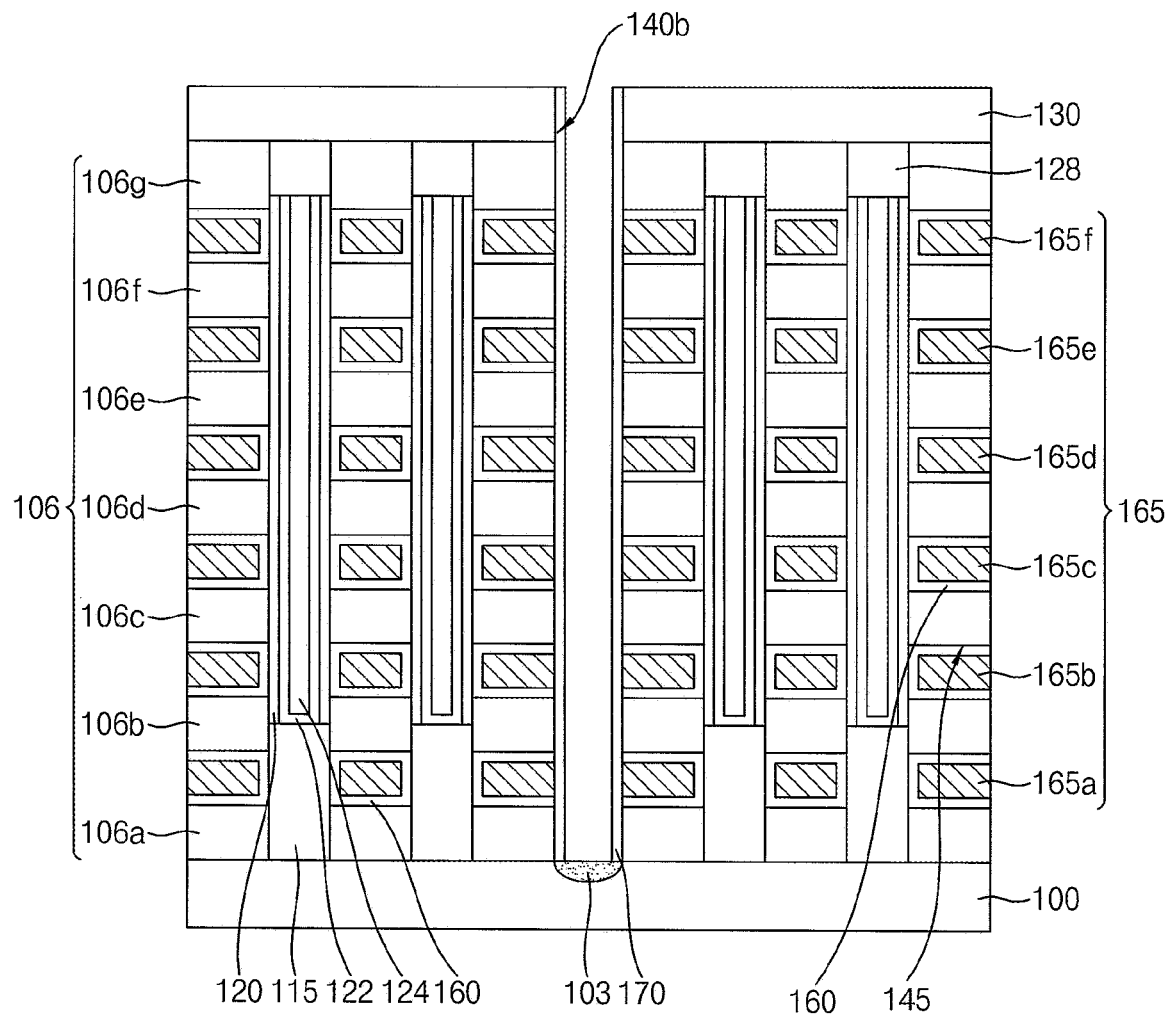

Referring to FIGS. 17 and 18, an impurity region 103 may be formed at an upper portion of the substrate 100 exposed through the opening 140 by an ion-implantation process. The impurity region 103 may extend in, e.g., the second direction.

An insulation spacer 170 may be formed on a sidewall of the opening 140. For example, an insulation layer may be formed along the top surface of the first upper insulation layer 130, and the sidewalls and the bottoms of the openings 140. Portions of the insulation layer formed on the top surface of the first upper insulation layer 130 and the bottoms of the opening 140 may be removed by a CMP process and/or an etch-back process to form the insulation spacer 170.

The insulation layer may be formed of silicon oxide by an ALD process or a CVD process. The insulation layer may be formed conformally along a sidewall profile of the first openings 140*a* and the second openings 140*b*.

Figure 19:
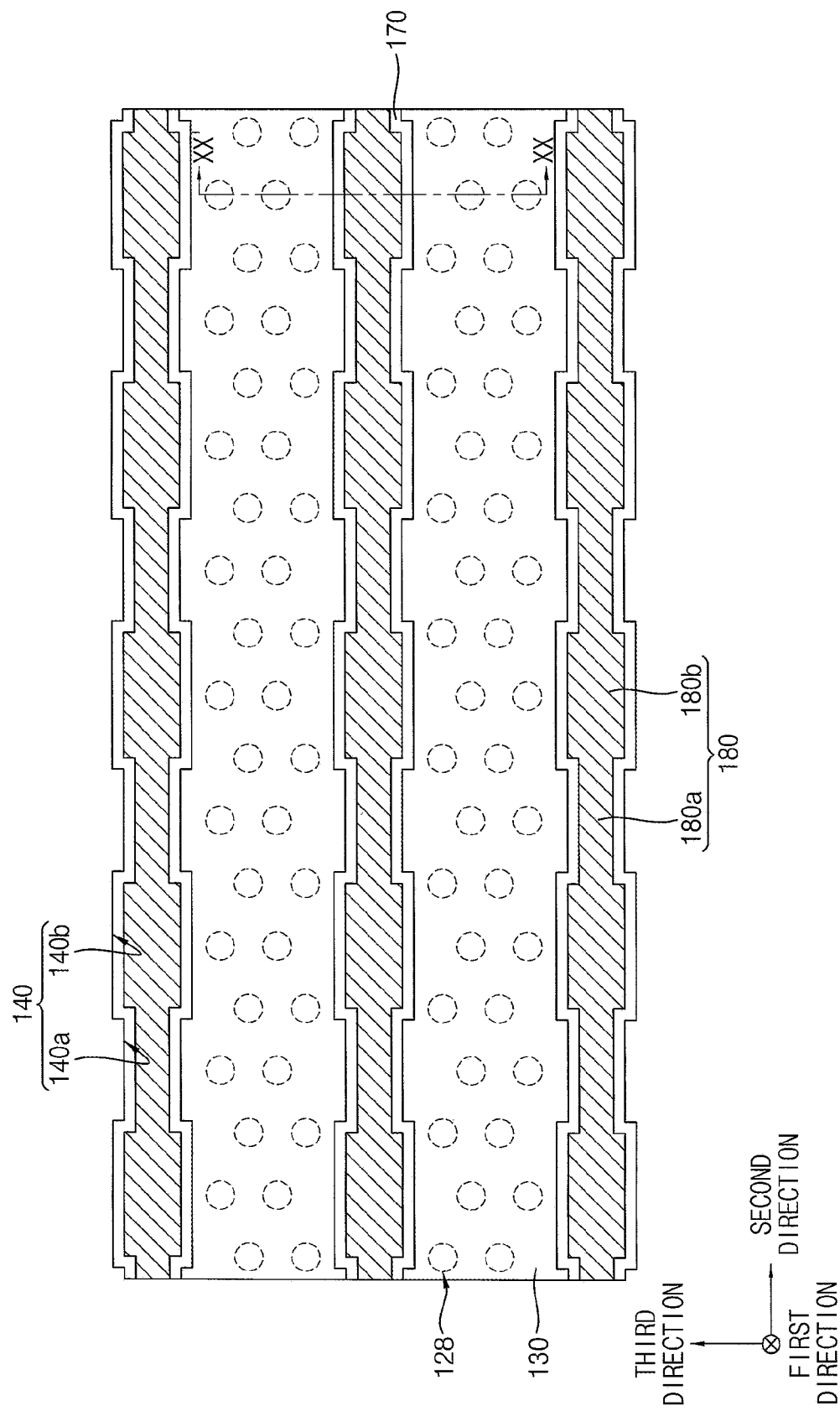
Figure 20:
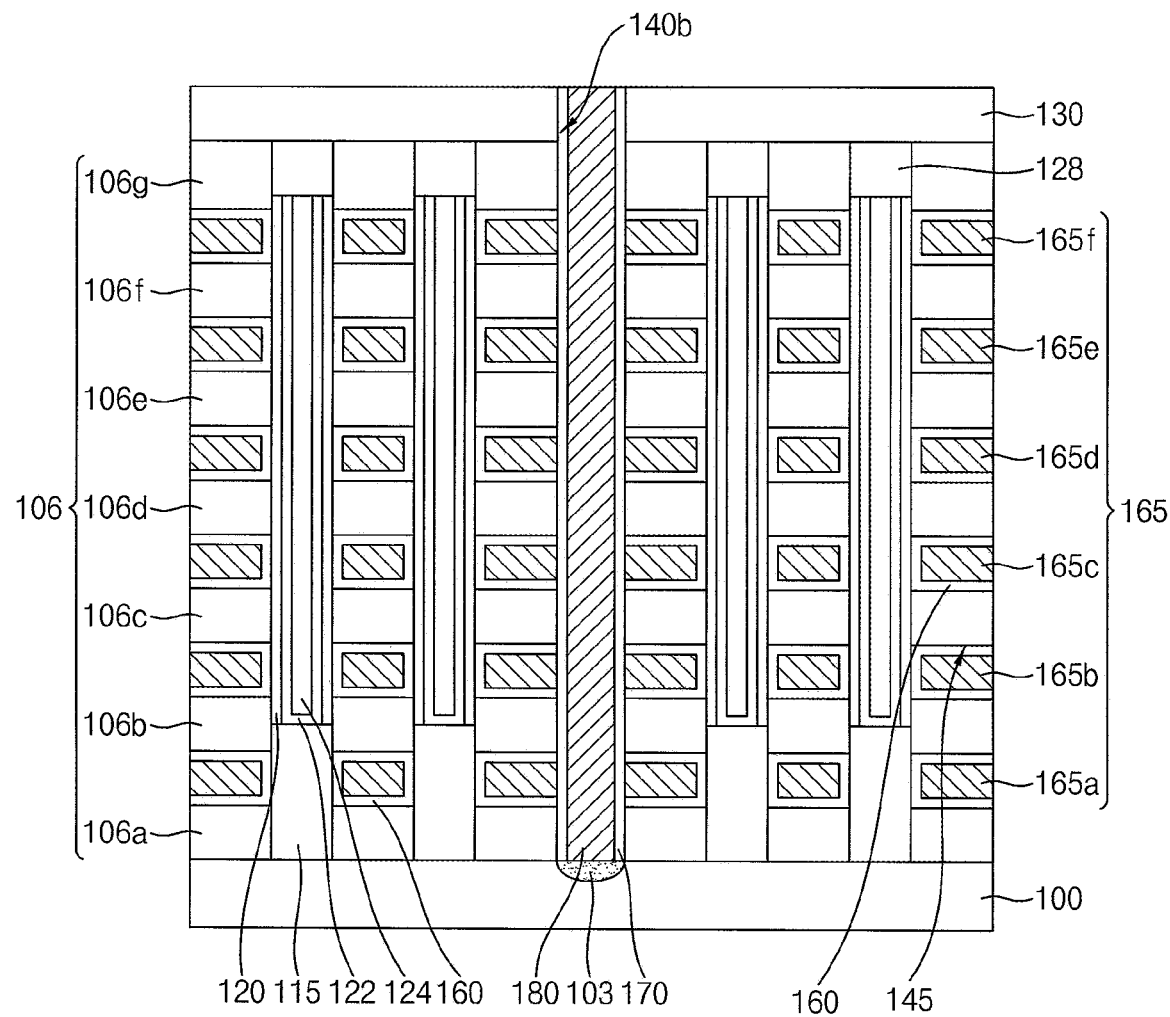

Referring to FIGS. 19 and 20, a conductive line 180 may be formed in the opening 140.

In example embodiments, a metallic material such as tungsten, aluminum, copper, or the like may be deposited in the opening 140 by a sputtering process or an ALD process to form the conductive line 180. In example embodiments, the conductive line 180 may be formed by a plating process, e.g., a copper electroplating process.

In example embodiments, the conductive line 180 may include a first portion 180*a* and a second portion 180*b* formed in the first opening 140*a* and the second opening 140*b*, respectively. A plurality of the first portions 180*a* and the second portions 180*b* may be alternately repeated in the conductive line 180.

A width of the second portion 180*b* may be greater than that of the first portion 180*a*, and a volume of the second portion 180*b* may be greater than that of the first portion 180*a*. The second portion 180*b* may have a rectangular cross-section in a plan view.

In example embodiments, while performing the deposition process or the plating process, an area for an initial adsorption or an initial attachment of the metallic material may increase by the second openings 140*b* having an expanded width. Thus, sufficient seeds for a growth of a metal layer may be achieved during a progression of the deposition process or the plating process. Therefore, defects including, e.g., voids, seams and/or cracks may be reduced in the conductive line 180 through the opening 140. Further, the insulation spacer 170 may be protected from being damaged by an outgassing from the defects.

The conductive line 180 may be electrically connected to the impurity region 103, and may serve as a CSL of the vertical memory device. A metal silicide pattern including, e.g., nickel silicide or cobalt silicide may be further formed between the conductive line 180 and the impurity region 103.

According to the shape of the conductive line 180 or the opening 140 as described above, the gate line 165 may also have a structure in which a width may repeatedly increase and decrease.

Figure 21:
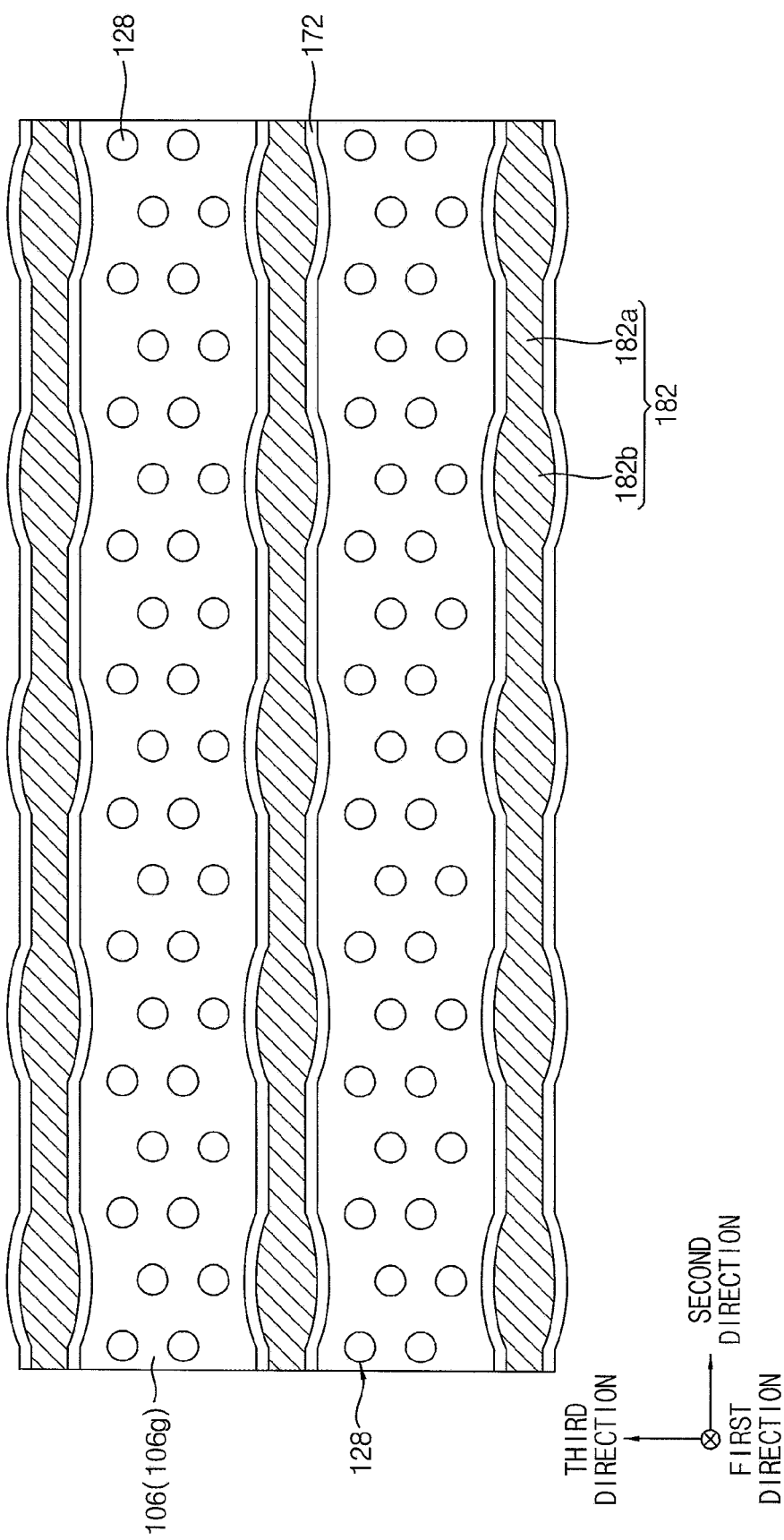
FIG. 21 is a top plan view illustrating a vertical memory device in accordance with example embodiments.

FIG. 21 is a top plan view illustrating a vertical memory device in accordance with example embodiments. FIG. 22 is a partially enlarged top plan view illustrating portions of a gate line and conductive lines in accordance with example embodiments;

The vertical memory device illustrated in FIGS. 21 and 22 may have elements and/or constructions substantially the same as or similar to those illustrated with reference to FIGS. 1 to 3 except for a shape of a conductive line. Thus, detailed descriptions on repeated elements and/or structures are omitted herein, and like reference numerals are used to designate like elements.

Referring to FIG. 21, a conductive line 182 may include first portions 182*a* and second portions 182*b* arranged alternately and repeatedly, and the second portion 182*b* may have a width greater than that of the first portion 182*a*.

In example embodiments, the second portion 182*b* may have a substantially curved surface, may have a substantially elliptical cross-section in a plan view. For example, the second portion 182*b* may be included in the conductive line 182 as an embossed pattern.

Referring to FIG. 22, a boundary area 144 between the first portion 182*a* and the second portion 182*b* may have a curved surface. For example, an insulation spacer 172 at the boundary area 144 may have a convex surface profile, and the conductive line 182 at the boundary area 144 may have a concave surface profile.

According to the shape of the conductive line as described above, the gate line 166 may include protrusions 166*a* and recessed portions 166*b* alternately repeated.

FIGS. 23 to 25 are top plan views illustrating a process of forming a conductive line in accordance with example embodiments. Detailed descriptions on processes substantially the same as or similar to those illustrated with reference to FIGS. 5 to 20 are omitted herein.

Referring to FIG. 23, processes substantially the same as or similar to those illustrated with reference to FIGS. 5 to 13 may be performed.

Accordingly, a vertical channel structure including a dielectric layer structure 120, a channel 122 and a filling insulation pattern 124 may be formed. Gate lines 166 and insulating interlayer patterns (not illustrated) surrounding the vertical channel structures and being cut by an opening 142 may be formed.

The opening 142 may include a first opening 142*a* having a relatively narrow width and a second opening 142*b* having a relatively large width. In example embodiments, the second opening 142*b* may have an elliptical shape in a plan view. The opening 142 may have a curved surface profile at a boundary area 144 between the first opening 142*a* and the second opening 142*b*.

Referring to FIG. 24, as also described with reference to FIGS. 17 and 18, an insulation spacer 172 may be formed on a sidewall of the opening 142. After forming the insulation spacer 172, a metal deposition process or a metal plating process for forming a conductive line may be performed on the insulation spacer 172.

At an initial stage of the metal deposition process or the metal plating process, a curved portion of the boundary area 144 may serve as a deposition initiating site or a plating initiating site. Thus, a seed layer 181 that may be relatively thick at the curved portion of the boundary area 144 may be formed. The seed layer 181 may partially fill the opening 142 on the insulation spacer 172.

Referring to FIG. 25, the metal deposition process or the metal plating process may further progress to form a conductive line 182 that may fully fill the opening 142, and may include a first portion 182a and a second portion 182b.

The seed layer 181 formed from the curved portion may be provided on an entire surface of the insulation spacer 172 so that the conductive line 182 without defects such as voids, seams and/or cracks may be formed.

FIG. 26 is a partially enlarged top plan view illustrating portions of a gate line and conductive lines in accordance with example embodiments.

Referring to FIG. 26, as also described with reference to FIGS. 21 and 22, an opening 142 may include a first opening 142a and a second opening 142b, and a boundary area between the first opening 142a and the second opening 142b may include a curved portion.

An insulation spacer 175 may be formed on a sidewall of the opening 142. An insulation spacer 175 may be divided into a first portion 175a and a second portion 175b depending on the shape of the opening 142. In example embodiments, as the first opening 142a may be expanded to the second opening 142b, the insulation spacer 175 may be formed to be relatively thin in the second opening 142b. Thus, the second portion 175b of the insulation spacer 175 may be thinner than the first portion 175a.

A conductive line 184 may be formed on a sidewall of the insulation spacer 175 in the opening 142. As a thickness of the insulation spacer 175 may be reduced in the second opening 142b, a space of the second opening 142b for forming the conductive line 184 may be additionally achieved.

In this case, a metal deposition or a metal plating may be initiated from the second opening 142b, and the metal deposition or the metal plating may sufficiently progress into the first opening 142a. Thus, the conductive line 184 devoid of voids, seams and/or cracks may be formed through the opening 142.

Figure 27:
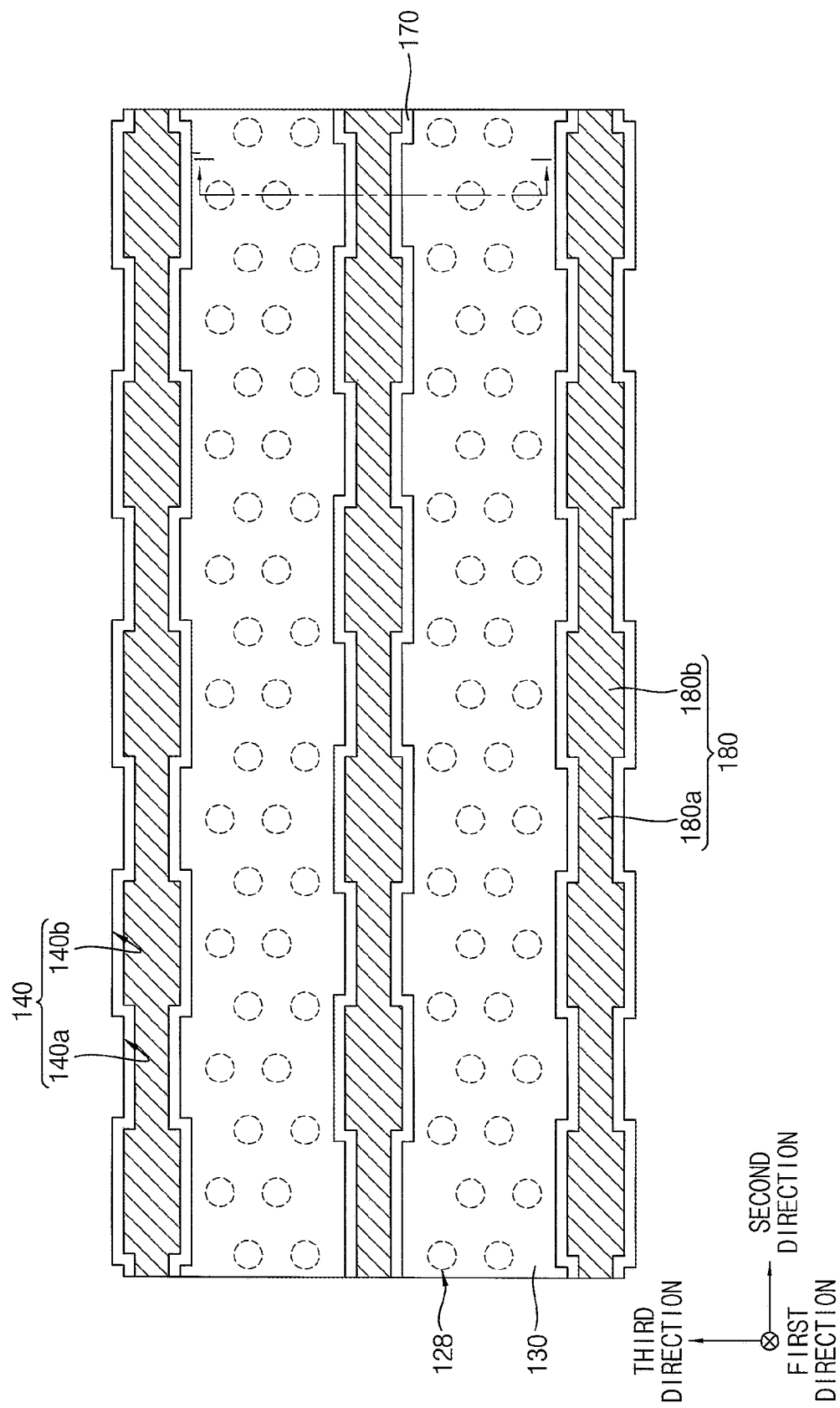
FIGS. 27 and 28 are top plan views illustrating vertical memory devices in accordance with example embodiments.
Figure 28:
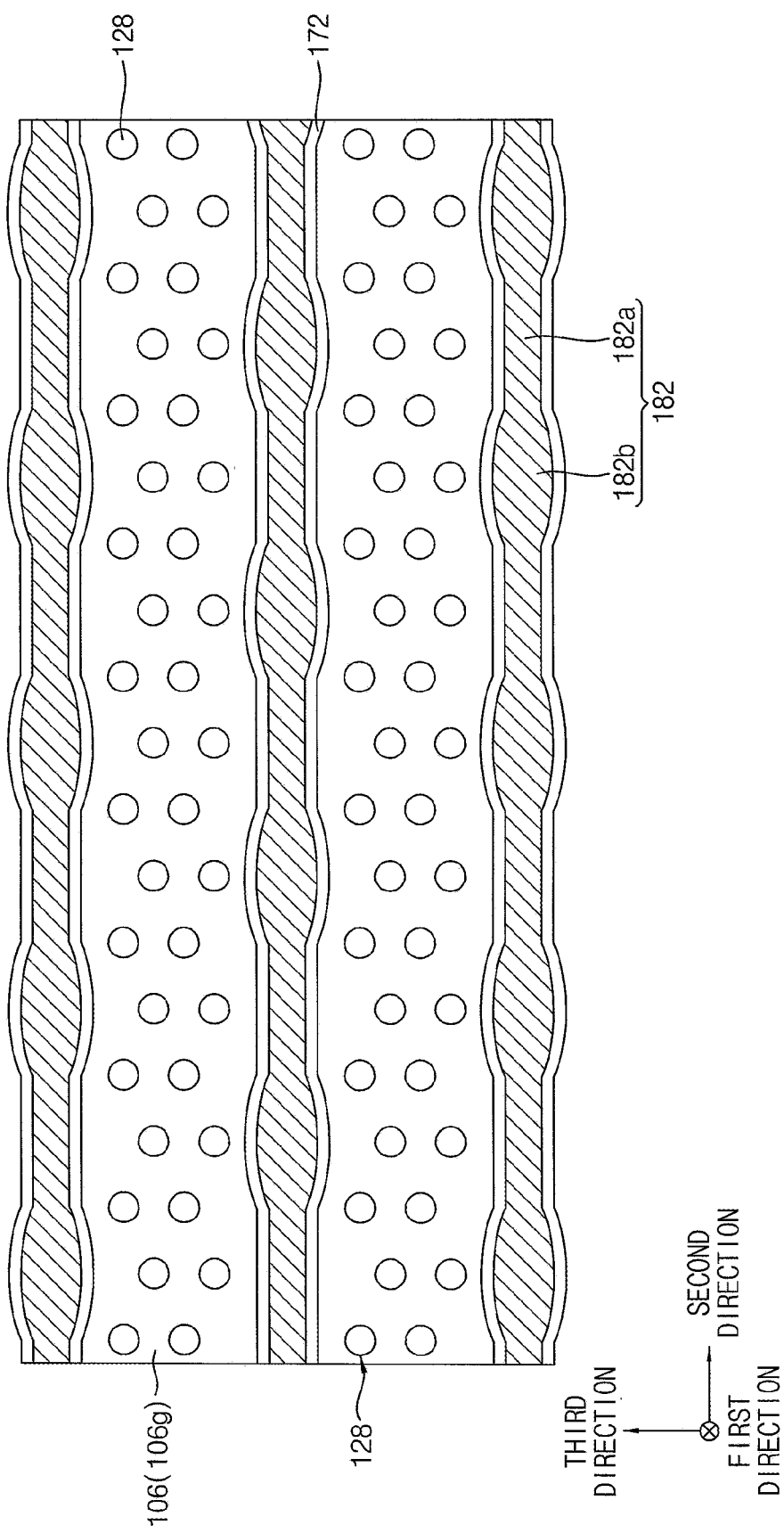

FIGS. 27 and 28 are top plan views illustrating vertical memory devices in accordance with example embodiments. The vertical memory devices illustrated in FIGS. 27 and 28 may have elements and/or constructions substantially the same as or similar to those illustrated in FIGS. 1 and 21 except for shapes of conductive lines. Thus, detailed descriptions on repeated elements and/or structures are omitted herein, and like reference numerals are used to designate like elements.

Referring to FIG. 27, as also described with reference to FIG. 1, a conductive line 180 may include first portions 180a and second portions 180b alternately repeated along the second direction. A plurality of the conductive lines 180 may be arranged along the third direction.

In example embodiments, the second portions 180b included in the different conductive lines 180 may be arranged in a staggered configuration or a zigzag configuration. For example, as illustrated in FIG. 27, the first portion 180a and the second portion 180b may face each other along the third direction. The second portion 180b may have, e.g., a rectangular shape in a plan view.

In example embodiments, a gate line 165 may have a substantially saw shape in a plan view, and a width of the gate line 165 in the third direction may be substantially uniform. Thus, an area for forming channels or pads 128 in the gate line 165 may be achieved.

Referring to FIG. 28, as also described with reference to FIG. 21, a conductive line 182 may include first portions 182a and second portions 182b alternately repeated along the second direction. A plurality of the conductive lines 182 may be arranged along the third direction. For example, the second portion 182b may have an elliptical or embossed cross-section in a plan view.

In example embodiments, the second portions 182b included in the different conductive lines 182 may be arranged in a staggered configuration or a zigzag configuration. For example, as illustrated in FIG. 28, the first portion 182a and the second portion 182b may face each other along the third direction.

In example embodiments, a gate line 166 may include a plurality of recessed portions formed in a zigzag configuration, and a width of the gate line 166 in the third direction may be substantially uniform. Thus, an area for forming channels or pads 128 in the gate line 166 may be achieved.

Figure 29:
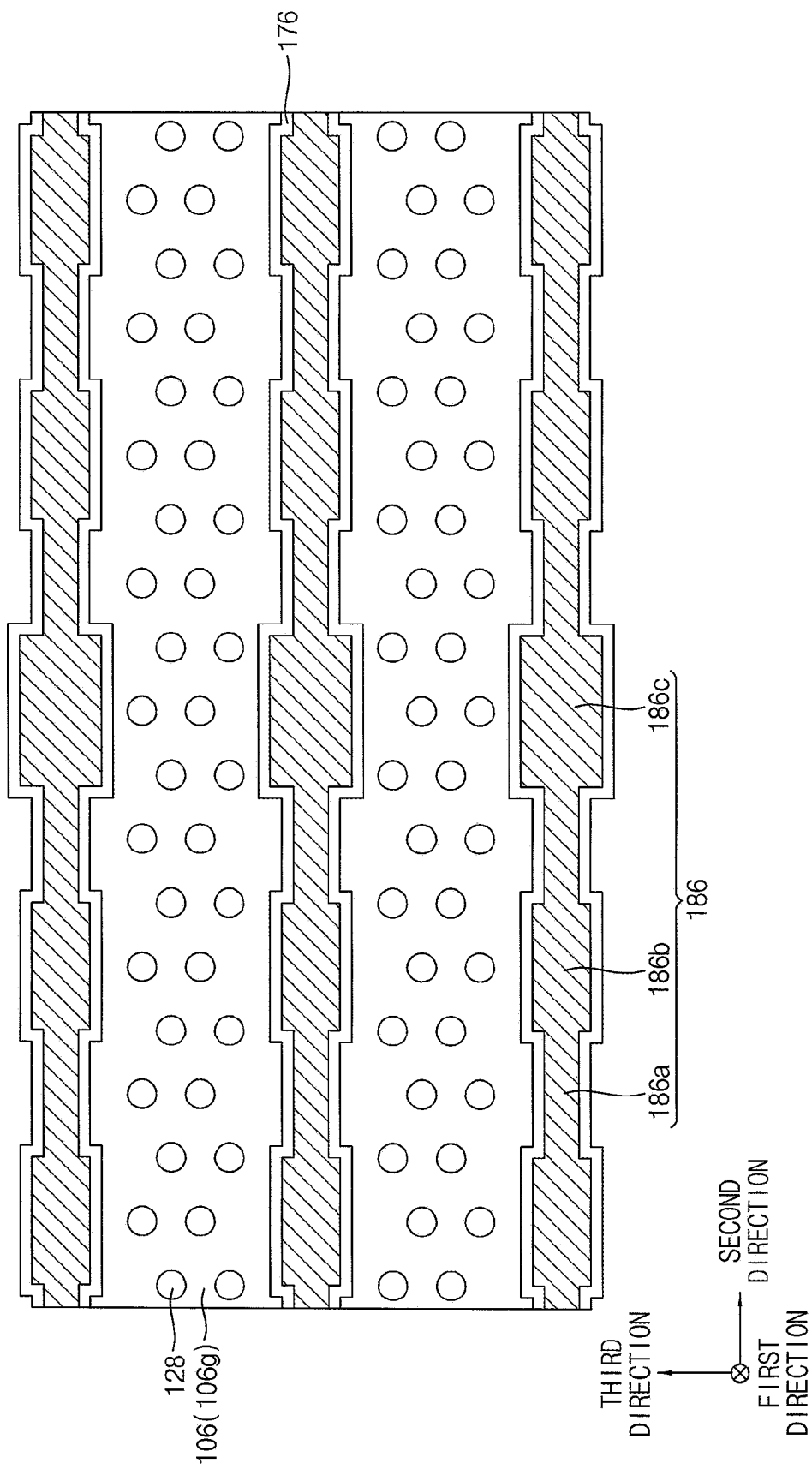
FIGS. 29 to 31 are top plan views illustrating vertical memory devices in accordance with example embodiments.
Figure 30:
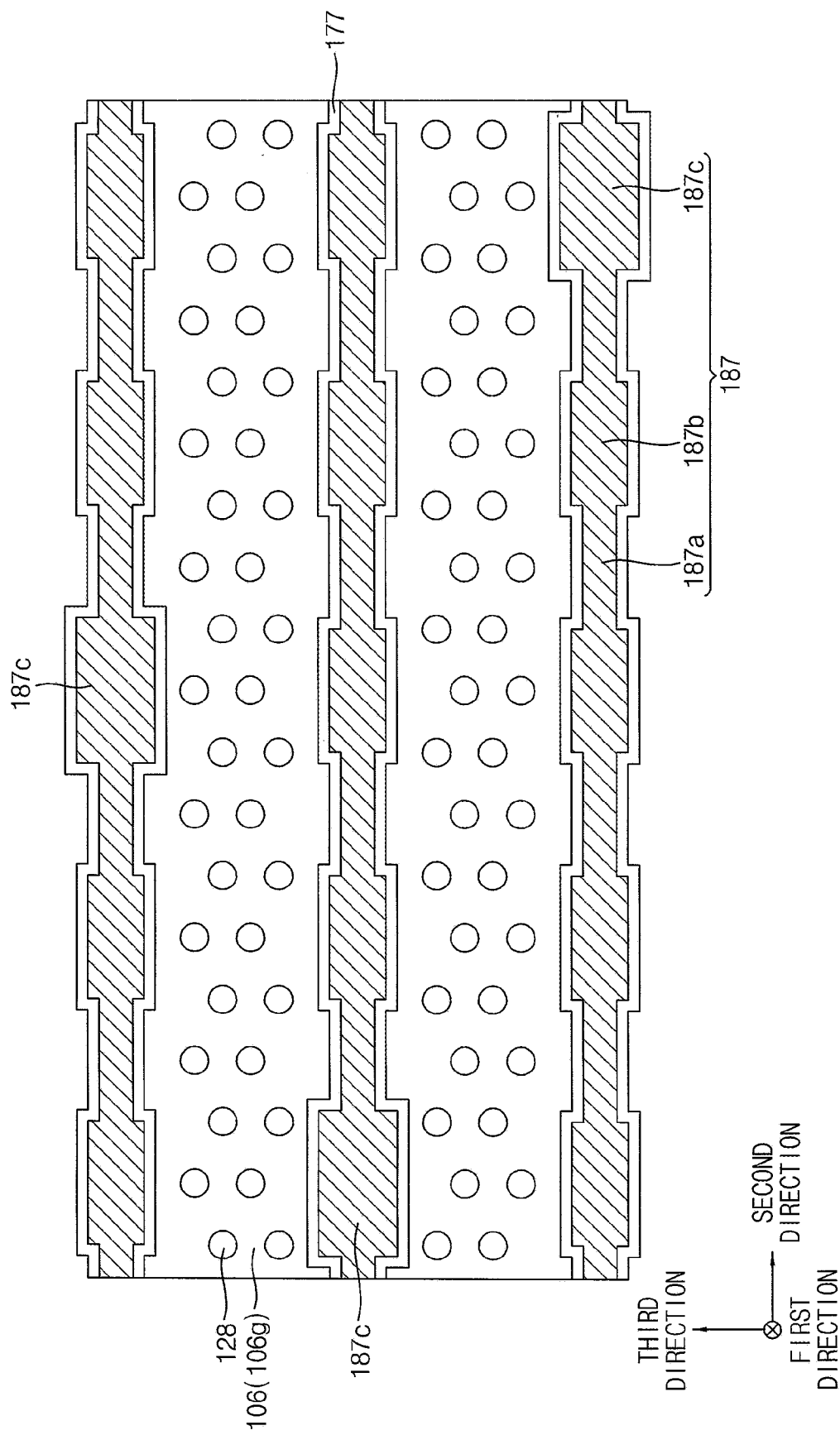
Figure 31:
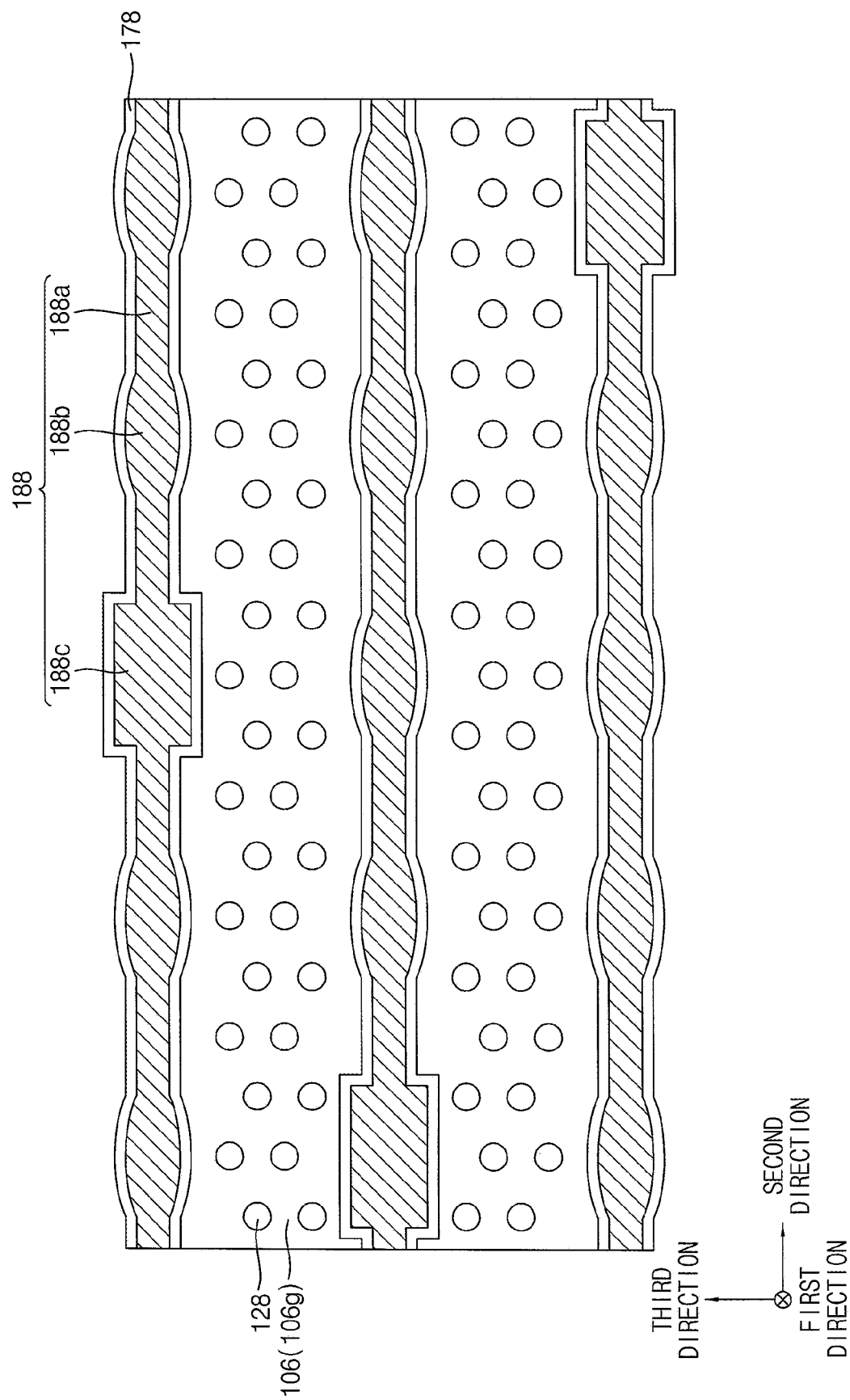

FIGS. 29 to 31 are top plan views illustrating vertical memory devices in accordance with example embodiments. The vertical memory devices illustrated in FIGS. 29 to 31 may have elements and/or constructions substantially the same as or similar to those illustrated in FIGS. 1 to 3 except for shapes of conductive lines. Thus, detailed descriptions on repeated elements and/or structures are omitted herein, and like reference numerals are used to designate like elements.

Referring to FIG. 29, a plurality of conductive lines 186 may be arranged along the third direction. For example, 4 pad rows may be included between the neighboring conductive lines 186. Pads 128 may be formed in an uppermost insulating interlayer pattern 106g.

As described above, an opening may be formed through gate lines and insulating interlayer patterns along the first direction, and an insulation spacer 176 may be formed on a sidewall of the opening.

In example embodiments, the conductive line 186 may include first portions 186a and second portions 186b that may be alternately repeated. At least one of the second portions 186b may serve as a pad electrically connected to a contact that may be interconnected to a wiring disposed over the conductive line 186.

As illustrated in FIG. 29, the pad may be referred to as a third portion 186c. In example embodiments, the third portion 186c may have a width greater than that of the second portion 186b, and the width of the second portion 186b may be greater than that of the first portion 186a.

In example embodiments, the third portions 186c included in the different conductive line 186 may be arranged along a common straight line in the third direction.

Referring to FIG. 30, a conductive line 187 may include a first portion 187a, a second portion 187b and a third portion 187c as described above. In example embodiments, the third portions 187c included in the different conductive lines 187 may be staggered to each other along the third direction, or may not overlap along the third direction. The third portions 187c having a width greater than those of the first and second portions 187a and 187b may be arranged in a zigzag arrangement, so that a space for forming pads 128 or channels may be easily achieved.

An insulation spacer 177 may be formed on a sidewall of the conductive line 187 or an opening.

Referring to FIG. 31, a first portion 188*a*, a second portion 188*b* and a third portion 188*c* of a conductive line 188 may have different shapes from each other.

For example, as also illustrated in FIGS. 21 and 22, the second portion 188*b* may have an elliptical shape or an embossed shape. Accordingly, as described with reference to FIGS. 23 to 25, an efficiency of a metal deposition or a metal plating may be improved.

In example embodiments, the third portion 188*c* may have a width greater than that of the second portion 188*b*, and may have a substantially rectangular cross-section. The third portion 188*c* may have a different shape from that of the second portion 188*b* so that a contact may be easily aligned with the third portion 188*c* serving as a pad.

An insulation spacer 178 may be formed on a sidewall of the conductive line 188 or an opening.

Figure 32:
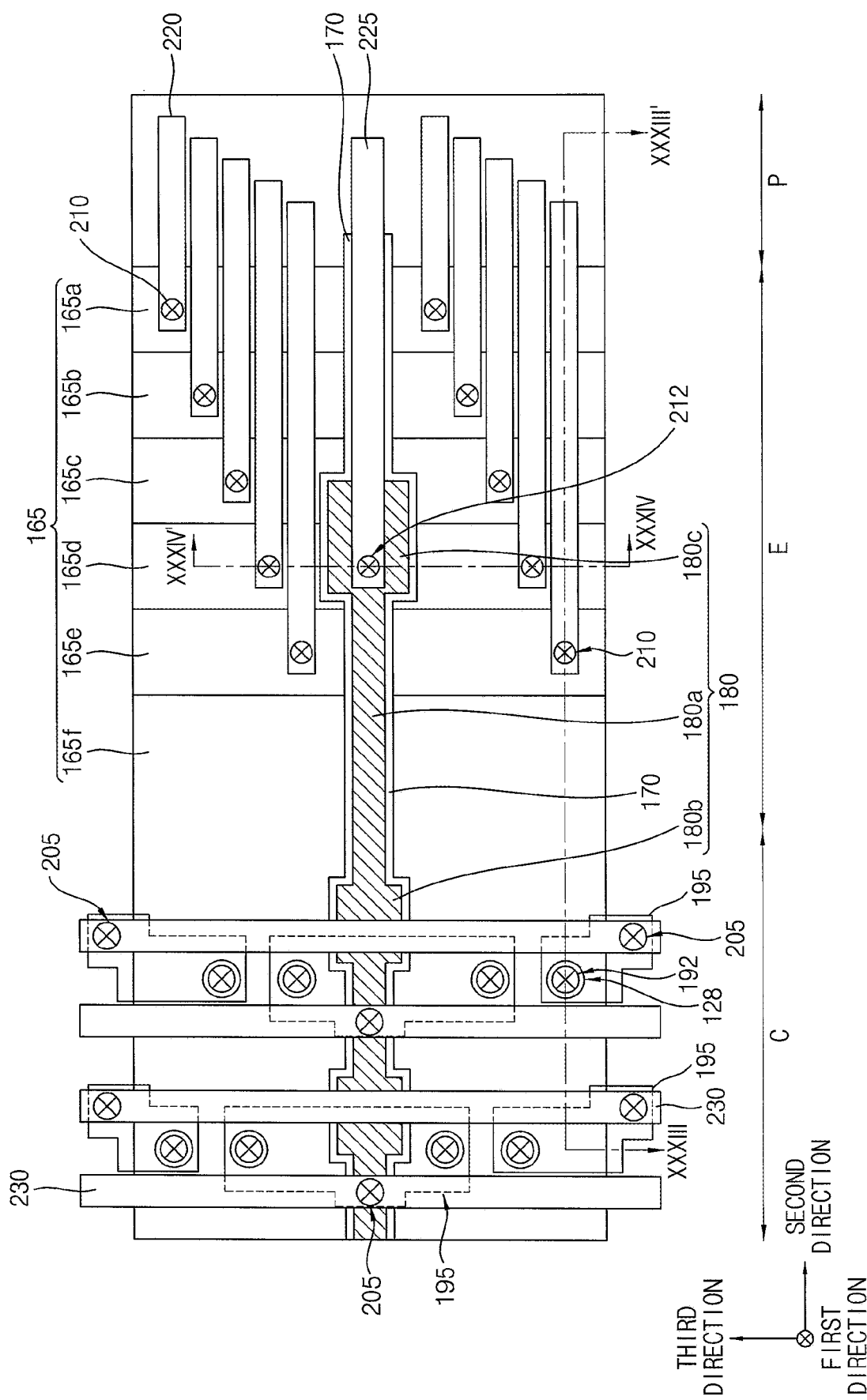
FIGS. 32 to 34 are a top plan view and cross-sectional views illustrating a vertical memory device in accordance with example embodiments.
Figure 33:
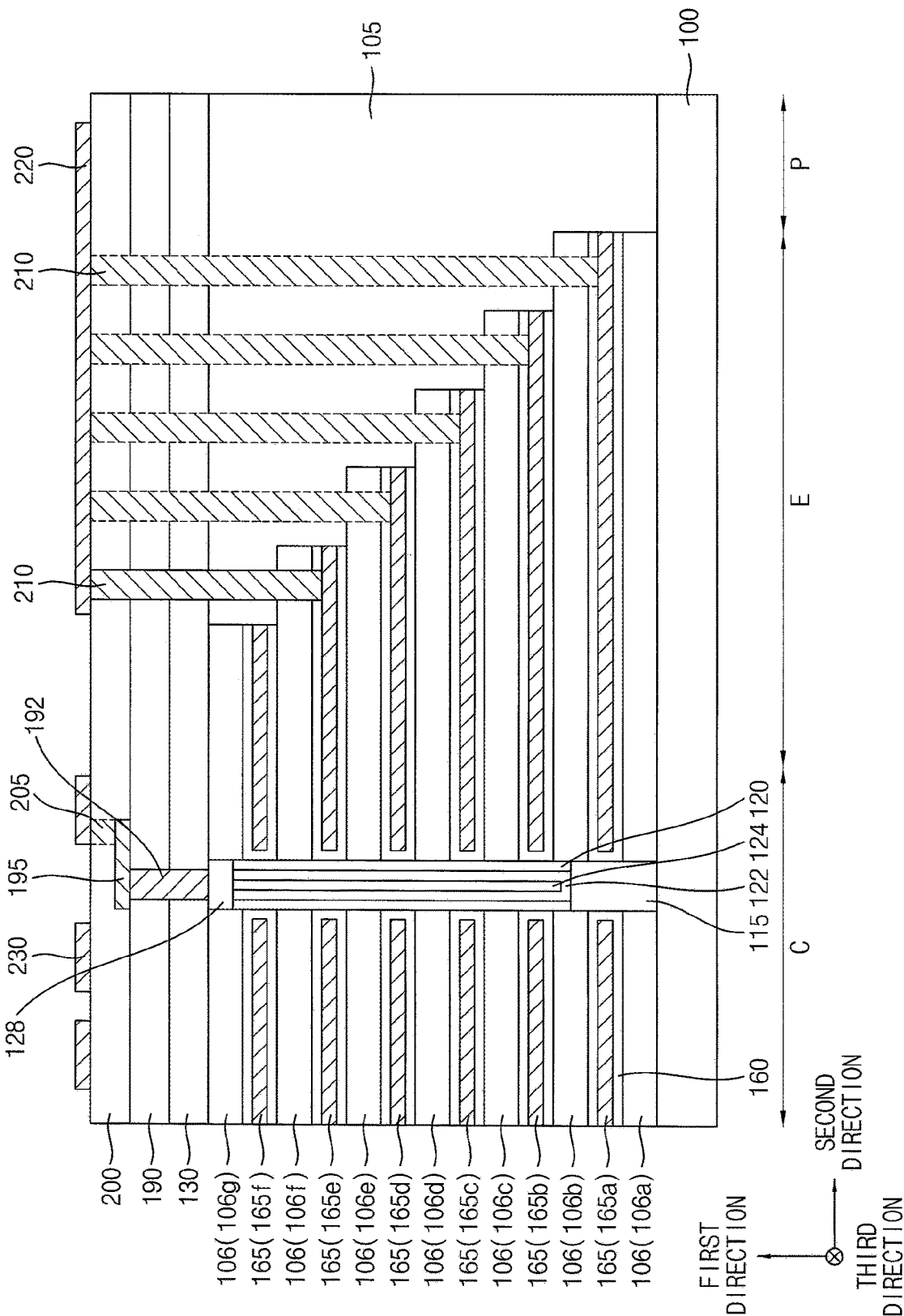
Figure 34:
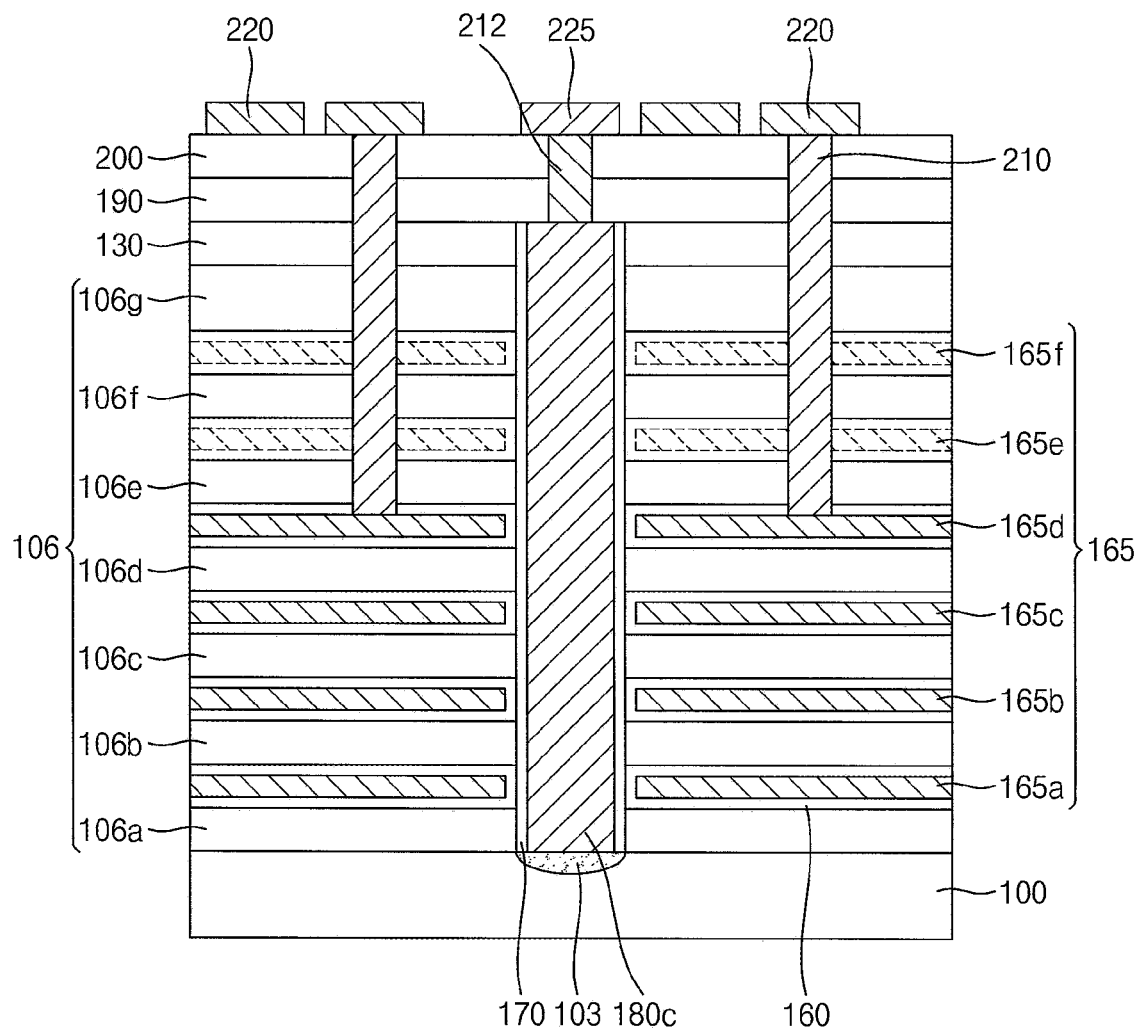

FIGS. 32 to 34 are a top plan view and cross-sectional views illustrating a vertical memory device in accordance with example embodiments.

Specifically, FIG. 32 is a top plan view illustrating the vertical memory device. FIGS. 33 and 34 are cross-sectional views taken along lines XXXIII-XXXIII' and XXXIV'-XXXIV', respectively, of FIG. 32.

Detailed descriptions on elements and/or constructions substantially the same as or similar to those illustrated with reference to FIGS. 1 to 3 are omitted herein, and like reference numerals are used to designate like elements.

Referring to FIGS. 32 to 34, a substrate 100 may include, e.g., a cell region C, an extension region E and a peripheral region P.

Gate lines 165 (e.g., 165*a* through 165*f*) and insulating interlayer patterns 106 (e.g., 106*a* through 106*g*) may be alternately and repeatedly along the first direction on the cell region C and the extension region E. Vertical channel structures, each of which may include a dielectric layer structure 120, a channel 122 and a filling insulation pattern 124, may extend through the gate lines 165 and the insulating interlayer patterns 106 on the cell region C. The vertical channel structure may be disposed on a semiconductor pattern 115.

Widths or lengths in the second direction of the gate lines 165 and the insulating interlayer patterns 106 may be reduced along the first direction from a top surface of the substrate 100. For example, the gate lines 165 and the insulating interlayer patterns 106 may be stacked in a pyramidal shape or a stepped shape along the first direction. The gate line 165 at each level may be at least partially surrounded by an interface pattern 160.

As illustrated in FIG. 33, the insulating interlayer pattern 106 and the gate line 165 at each level may include step portions protruding in the second direction. The step portions may be arranged on the extension region E.

In example embodiments, a pair of the extension regions E may be symmetrically located with respect to the cell region C. Accordingly, the step portions may be also symmetrically arranged in the second direction.

A mold protection layer 105 covering the step portions may be formed on the substrate 100. The mold protection layer 105 may include an insulation material, e.g., silicon oxide.

A pad 128 may be formed on the vertical channel structure, and a first upper insulation layer 130 covering an uppermost insulating interlayer pattern 106*g*, the pads 128 and the mold protection layer 105 may be formed.

In example embodiments, the conductive line 180 may extend through the first upper insulation layer 130, the insulating interlayer patterns 106, the gate lines 165 and the mold protection layer 105, and may extend in the second direction. An insulation spacer 170 may be formed on a sidewall of the conductive line 180.

The conductive line 180 may extend in the second direction throughout the cell region C and the extension region E. As described above, the conductive line 180 may include a first portion 180*a*, a second portion 180*b* and a third portion 180*c*. A width (e.g., a width in the third direction) of the third portion 180*c* may be greater than that of the second portion 180*b*, and the width of the second portion 180*b* may be greater than that of the first portion 180*a*.

In example embodiments, the second portions 180*b* may be arranged on the cell region C. In example embodiments, the third portion 180*c* may be arranged on the extension region E.

A second upper insulation layer 190 may be formed on the first upper insulation layer 130, the insulation spacer 170 and the conductive line 180. A first contact 192 may be formed through the second upper insulation layer 190 and the first upper insulation layer 130 to be electrically connected to the pad 128.

A connecting wiring 195 may be formed on the second upper insulation layer 190 to be electrically connected to a desired (and/or alternatively predetermined) number of the first contacts 192. A third upper insulation layer 200 may be formed on the second upper insulation layer 190 and the connecting wiring 195.

Bit lines 230 may be disposed on a portion of the third upper insulation layer 200 on the cell region C. The bit line 230 may extend in the third direction, and may be electrically connected to the connecting wiring 195 via a second contact 205. The connecting wiring 195 may be provided as a routing wiring for connecting the bit line 230 and the pad 128.

A first wiring 220 and a second wiring 225 may be disposed on the extension region E. The first wiring 220 and the second wiring 225 may be disposed on the third upper insulation layer 200, and may extend in the second direction from the extension region E to the peripheral region P.

The first wiring 220 may be electrically connected to the gate line 165 of each level via a third contact 210. In example embodiments, the third contacts 210 and the first wirings 220 connected to a GSL (e.g., the gate line 165*a*) and word lines (e.g., the gate lines 165*b* to 165*e*) may be disposed on one of the pair of the extension regions E. The third contacts 210 and the first wirings 220 connected to an SSL (e.g., the gate line 165*f*) may be disposed another extension region E facing the one of the extension regions E with respect to the cell region C.

As illustrated in FIG. 33, the third contacts 210 may extend through the third to first upper insulation layers 200, 190 and 130, the mold protection layer 105 and the insulating interlayer pattern 106 at each level to be in contact with the gate lines 165.

A predetermined or desired voltage may be applied to the gate lines 165 through the first wirings 220.

The second wiring 225 may be electrically connected to the third portion 180*c* of the conductive line 180 via a fourth contact 212. The third portion 180*c* may serve as a pad on which the fourth contact 212 may be formed.

As illustrated in FIG. 34, the fourth contact 212 may be formed through the third upper insulation layer 200 and the second upper insulation layer 190 to be in contact with the third portion 180c of the conductive line 180.

A source voltage may be applied to the conductive line 180 serving as a CSL through the second wiring 225.

The first and second wirings 220 and 225 may be electrically connected to the peripheral circuit (not illustrated) formed on the substrate 100 of the peripheral region P.

According to example embodiments of inventive concepts, an opening for forming a conductive line between gate line stack structures may be formed to have a structure in which an increase and decrease of a width may be repeated. For example, the opening may include first openings having a relatively narrow width and second openings having a relatively large width. Thus, the conductive line may include first portions having a relatively narrow width and second portions having a relatively large width, and the first and second portions may be alternately repeated. As the width of the opening is changed repeatedly, a plurality of seeds for forming the conductive line may be generated. Thus, a metal may be uniformly deposited in the opening through the seeds. Therefore, the conductive line without defects, e.g., voids or cracks therein may be achieved.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A vertical memory device, comprising:
    gate lines spaced apart from each other on a substrate in a first direction vertical to a top surface of the substrate;
    channels extending through ones of the gate lines in the first direction; and
    opening structures extending through the gate lines on the substrate, each of the opening structures including first and second openings alternately and repeatedly arranged in a second direction parallel to the top surface of the substrate, the first and second openings having first and second widths, respectively, in a third direction that is parallel to the top surface of the substrate and crossing the second direction, the second width being greater than the first width, and the opening structures being spaced apart from each other in the third direction,
    wherein at least one of the channels is disposed between the second openings of neighboring ones of the opening structures in the third direction, the second openings facing each other in the third direction.

2. The vertical memory device of claim 1, wherein at least one of the channels is disposed between the first openings of neighboring ones of the opening structures in the third direction, the first openings facing each other in the third direction.

3. The vertical memory device of claim 1, wherein
    the channels are arranged in rows that are separated from each other in the third direction,
    at least one of the rows of channels includes only one channel therein between the first openings of neighboring ones of the opening structures in the third direction, the first openings facing each other in the third direction, and
    at least one of the rows of channels includes a plurality of channels between the second openings of neighboring ones of the opening structures in the third direction, the second openings facing each other in the third direction.

4. The vertical memory device of claim 1, wherein the second openings of each of the opening structures protrude in opposite directions along the third direction when compared to the first openings thereof.

5. The vertical memory device of claim 1, further comprising a conductive line in each of the opening structures.

6. The vertical memory device of claim 5, further comprising an insulation spacer along each of opposite sidewalls of the conductive line in the third direction.

7. The vertical memory device of claim 5, wherein the conductive line includes first and second portions in the first and second openings, respectively, in each of the opening structures, the first and second portions having third and fourth widths, respectively, in the third direction, and the fourth width being greater than the third width.

8. The vertical memory device of claim 7, wherein the first and second portions of the conductive line directly contact each other to form a continuous structure extending in the second direction.

9. The vertical memory device of claim 7, wherein the conductive line further includes at least one third portion configured as a pad.

10. The vertical memory device of claim 9, wherein a width of the at least one third portion of the conductive line in the third direction is greater than a width of the second portion thereof in the third direction.

11. The vertical memory device of claim 9, wherein the conductive line includes a plurality of third portions configured as pads, respectively, and
    wherein the plurality of third portions included in different conductive lines are staggered along the third direction in a plan view.

12. The vertical memory device of claim 11, wherein the second openings of each of the opening structures have an elliptical cross-section in a plan view.

13. A vertical memory device, comprising:
gate lines spaced apart from each other on a substrate in a first direction vertical to a top surface of the substrate;
channels extending through ones of the gate lines in the first direction; and
conductive lines cutting through the gate lines on the substrate, each of the conductive lines including first and second portions alternately and repeatedly arranged in a second direction parallel to the top surface of the substrate, the first and second portions having first and second widths, respectively, in a third direction that is parallel to the top surface of the substrate and crossing the second direction, the second width being greater than the first width, and the conductive lines being spaced apart from each other in the third direction,
wherein the channels are arranged in rows that are separated from each other in the third direction, and
wherein ones of the channels in at least one of the rows of channels within an area between neighboring ones of the conductive lines in the third direction are spaced apart from each other by a constant distance in the second direction, the area being defined by one of the second portions and two of the first portions contacting respective boundaries of the one of the second portions in the second direction in each of the neighboring ones of the conductive lines.

14. The vertical memory device of claim 13, wherein ones of the channels in each one of the rows of channels within the area between the neighboring ones of the conductive lines in the third direction are spaced apart from each other by the constant distance in the second direction.

15. The vertical memory device of claim 13, wherein at least one of the rows of channels includes at least one of the channels between the second portions of the neighboring ones of the conductive lines in the third direction, the second portions facing each other in the third direction.

16. The vertical memory device of claim 13, further comprising a charge storage structure covering a sidewall of each of the channels.

17. The vertical memory device of claim 13, further comprising an insulation spacer along each of opposite sidewalls of each of the conductive lines in the third direction.

18. A vertical memory device, comprising:
a substrate including a cell region, an extension region and a peripheral region;
channels on the cell region of the substrate, each of the channels extending in a first direction vertical to a top surface of the substrate;
gate lines surrounding the channels and spaced apart from each other in the first direction on the substrate, each of the gate lines extending in a second direction parallel to the top surface of the substrate over the cell region and the extension region; and
conductive lines cutting through the gate lines along the first direction on the substrate, each of the conductive lines extending in the second direction over the cell region and the extension region and including first portions and second portions having first and second widths, respectively, in a third direction parallel to the top surface of the substrate and perpendicular to the second direction, and the second width being greater than the first width,
wherein at least one of the channels is disposed between the second portions of neighboring ones of the conductive lines in the third direction, the second portions facing each other in the third direction.

19. The vertical memory device of claim 18, wherein
a plurality of the channels is disposed between the second portions of the neighboring ones of the conductive lines in the third direction, the second portions facing each other in the third direction, and
one of the channels is disposed between the first portions of neighboring ones of the conductive lines in the third direction, the first portions facing each other in the third direction.

20. The vertical memory device of claim 18, wherein a plurality of the channels is disposed between the second portions of neighboring ones of the conductive lines in the third direction.

* * * * *